(12) United States Patent
Kumar et al.

(10) Patent No.: US 9,312,177 B2
(45) Date of Patent: *Apr. 12, 2016

(54) SCREEN PRINT MASK FOR LASER SCRIBE AND PLASMA ETCH WAFER DICING PROCESS

(71) Applicant: Applied Materials, Inc., Santa Clara, CA (US)

(72) Inventors: Prabhat Kumar, Fremont, CA (US); Brad Eaton, Menlo Park, CA (US); Wei-Sheng Lei, San Jose, CA (US); James S. Papanu, San Rafael, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

This patent is subject to a terminal disclaimer.

(21) Appl. No.: 14/099,707

(22) Filed: Dec. 6, 2013

(65) Prior Publication Data

US 2015/0162243 A1    Jun. 11, 2015

(51) Int. Cl.
*H01L 21/78* (2006.01)
*H01L 21/304* (2006.01)
*H01L 21/3065* (2006.01)
*B41F 15/08* (2006.01)
(Continued)

(52) U.S. Cl.
CPC ............. *H01L 21/78* (2013.01); *B23K 26/364* (2015.10); *B41F 15/08* (2013.01); *H01J 37/321* (2013.01); *H01J 37/32091* (2013.01); *H01L 21/3043* (2013.01); *H01L 21/3065* (2013.01); *H01L 21/67207* (2013.01); *H01J 2237/334* (2013.01)

(58) Field of Classification Search
CPC ........................................................ H01L 21/78
See application file for complete search history.

(56) References Cited

U.S. PATENT DOCUMENTS

| 4,049,944 A | 9/1977 | Garvin et al. |
| 4,339,528 A | 7/1982 | Goldman |

(Continued)

FOREIGN PATENT DOCUMENTS

| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 Pages.

(Continued)

*Primary Examiner* — Mohammad Choudhry
(74) *Attorney, Agent, or Firm* — Blakely Sokoloff Taylor Zaffman LLP

(57) ABSTRACT

Methods of using a screen-print mask for hybrid wafer dicing using laser scribing and plasma etch described. In an example, a method of dicing a semiconductor wafer having a plurality of integrated circuits separated by streets involves screen-printing a patterned mask above the semiconductor wafer, the patterned mask covering the integrated circuits and exposing the streets of the semiconductor wafer. The method also involves laser ablating the streets with a laser scribing process to expose regions of the semiconductor wafer between the integrated circuits. The method also involves plasma etching the semiconductor wafer through the exposed regions of the semiconductor wafer to singulate the integrated circuits. The patterned mask protects the integrated circuits during the plasma etching.

19 Claims, 17 Drawing Sheets

(51) Int. Cl.
*H01L 21/67* (2006.01)
*H01J 37/32* (2006.01)

(56) References Cited

U.S. PATENT DOCUMENTS

| | | | |
|---|---|---|---|
| 4,426,657 A * | 1/1984 | Abiru et al. | 257/660 |
| 4,447,596 A * | 5/1984 | Makino et al. | 528/353 |
| 4,684,437 A | 8/1987 | Donelon et al. | |
| 5,336,638 A | 8/1994 | Suzuki et al. | |
| 5,593,606 A | 1/1997 | Owen et al. | |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,759,275 B1 | 7/2004 | Lee et al. | |
| 6,803,247 B2 | 10/2004 | Sekiya | |
| 6,887,804 B2 | 5/2005 | Sun et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,754,584 B2 | 7/2010 | Kumakawa | |
| 7,767,551 B2 | 8/2010 | Arita et al. | |
| 7,767,554 B2 | 8/2010 | Arita et al. | |
| 7,776,720 B2 | 8/2010 | Boyle et al. | |
| 7,804,043 B2 | 9/2010 | Deshi | |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 8,927,393 B1 * | 1/2015 | Lei et al. | 438/462 |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0205182 A1 | 9/2006 | Soejima | |
| 2009/0047752 A1 * | 2/2009 | Yamazaki et al. | 438/96 |
| 2009/0255911 A1 | 10/2009 | Krishnaswami et al. | |
| 2010/0013036 A1 | 1/2010 | Carey | |
| 2010/0216313 A1 | 8/2010 | Iwai et al. | |
| 2010/0248451 A1 | 9/2010 | Pirogovsky et al. | |
| 2011/0014777 A1 | 1/2011 | Haji et al. | |
| 2011/0312157 A1 | 12/2011 | Lei et al. | |
| 2012/0216691 A1 | 8/2012 | Pasqualin et al. | |
| 2012/0322240 A1 | 12/2012 | Holden et al. | |
| 2013/0045554 A1 | 2/2013 | Yamazaki | |
| 2013/0065378 A1 | 3/2013 | Johnson et al. | |
| 2013/0224910 A1 | 8/2013 | Shi et al. | |
| 2013/0230972 A1 | 9/2013 | Johnson et al. | |
| 2014/0141596 A1 * | 5/2014 | Matsuzaki et al. | 438/462 |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

International Search Report and Written Opinion from PCT/US2014/067498 mailed Feb. 27, 2015, 11 pgs.

* cited by examiner

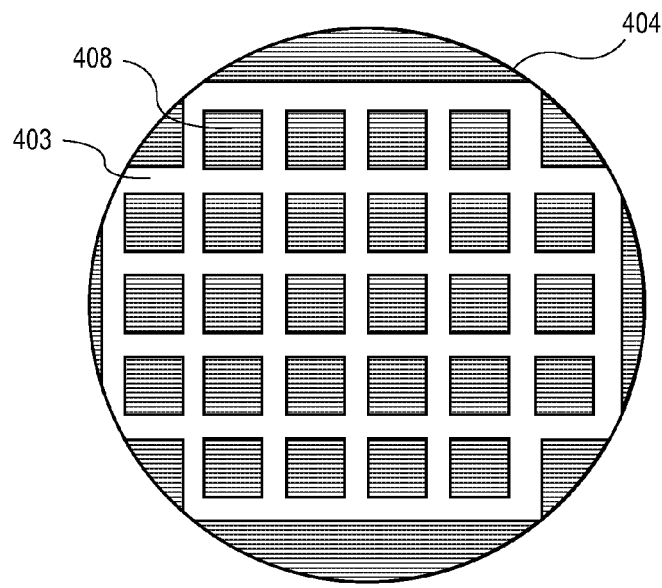
FIG. 4A1
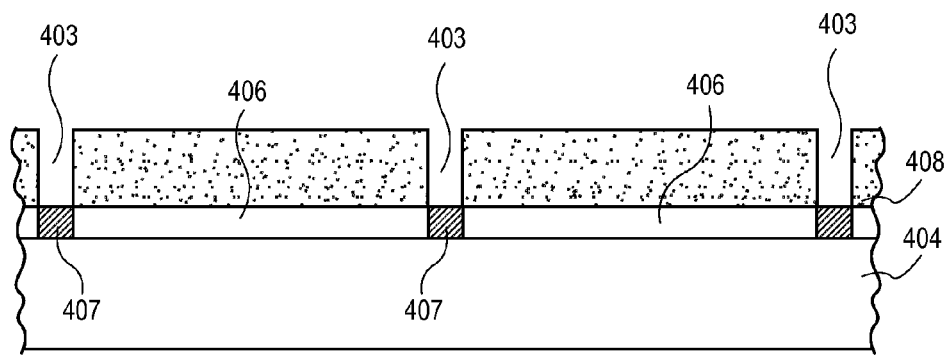
FIG. 4B1

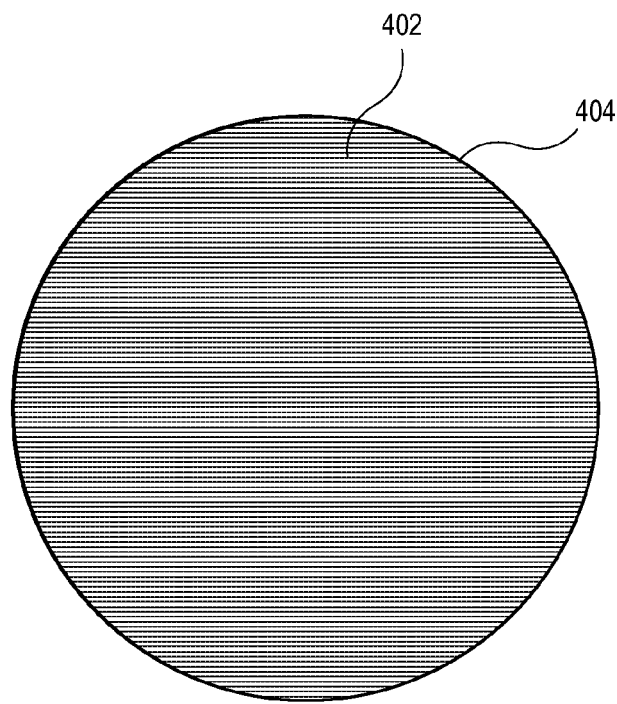
FIG. 4A2
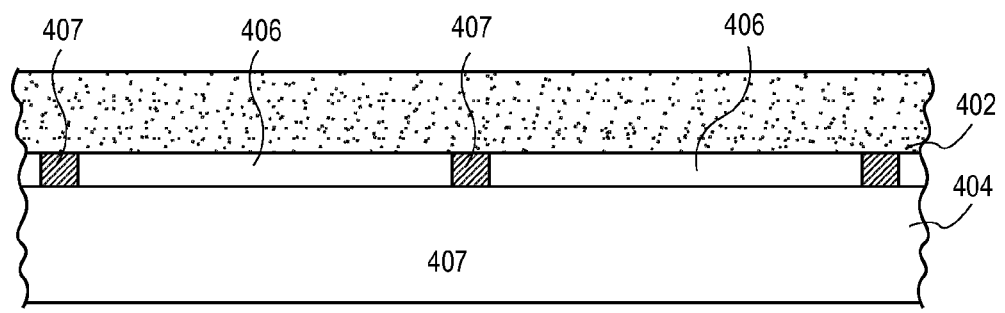
FIG. 4B2

$$I = \frac{E_p}{\pi \cdot w_0^2 \cdot \tau}$$

where $I$ is Intensity, $E_p$ is Pulse Energy, $w_0$ is Beam Radius, and $\tau$ is Pulse Width.

SCREEN PRINT MASK FOR LASER SCRIBE AND PLASMA ETCH WAFER DICING PROCESS

BACKGROUND

1) Field

Embodiments of the present invention pertain to the field of semiconductor processing and, in particular, to methods of dicing semiconductor wafers (or substrate), each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known semiconductor processes to form integrated circuits. Each wafer is processed to form a large number of individual regions containing integrated circuits known as die or dice.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dice. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dice. In addition, cracks can form and propagate from the edges of the dice into the device substrate and render the integrated circuit inoperative. Chipping and cracking are particularly a problem with scribing because only one side of a square or rectangular die can be scribed in the <110> direction of the crystalline structure. Consequently, cleaving of the other side of the die results in a jagged separation line. Because of chipping and cracking, additional spacing is required between the dice on the wafer to prevent damage to the integrated circuits, e.g., the chips and cracks are maintained at a distance from the actual integrated circuits. As a result of the spacing requirements, not as many dice can be formed on a standard sized wafer and capital invested for the device processing that could otherwise be used for circuitry is wasted. The use of a saw exacerbates the waste of real estate on a semiconductor wafer. The blade of the mechanical saw used for dicing purpose is approximate 15 µm thick. As such, to insure that cracking and other damage surrounding the cut made by the saw does not harm the integrated circuits, three to five hundred µm often must separate the circuitry of each of the die. Furthermore, after cutting, each die requires substantial cleaning to remove particles and other contaminants that result from the sawing process.

Plasma dicing is one of the advantageous technique which has the potential to improve the device performance compared to saw or scribe dicing due to no propagation of microcracks in the device, but may have limitations as well. For example, one limitation hampering implementation of plasma dicing may be cost. A standard lithography operation for patterning resist may render implementation cost prohibitive. Another limitation possibly hampering implementation of plasma dicing is that plasma processing of commonly encountered metals (e.g., copper) in dicing along streets can create production issues or throughput limits.

SUMMARY

One or more embodiments of the present invention are directed to methods of dicing semiconductor wafers, each wafer having a plurality of integrated circuits thereon.

In an embodiment, a method of dicing a semiconductor wafer having a plurality of integrated circuits separated by streets involves screen-printing a patterned mask above the semiconductor wafer, the patterned mask covering the integrated circuits and exposing the streets of the semiconductor wafer. The method also involves laser ablating the streets or metals in the streets with a laser scribing process to expose regions of the semiconductor wafer between the integrated circuits. The method also involves plasma etching the semiconductor wafer through the exposed regions of the semiconductor wafer to singulate the integrated circuits. The patterned mask protects the integrated circuits during the plasma etching process.

In another embodiment, as described in greater detail below, the laser ablating operation may be removed if there is no metal in the streets.

In another embodiment, a method of dicing a semiconductor wafer having a plurality of integrated circuits separated by streets involves screen-printing a blanket masking layer above the semiconductor wafer, the blanket masking covering the integrated circuits and the streets of the semiconductor wafer. The method also involves laser ablating portions of the blanket masking layer and the streets with a laser scribing process to provide a patterned mask and to expose regions of the semiconductor wafer between the integrated circuits. The method also involves plasma etching the semiconductor wafer through the exposed regions of the semiconductor wafer to singulate the integrated circuits. The patterned mask protects the integrated circuits during the plasma etching.

In another embodiment, a system for dicing a semiconductor wafer having a plurality of integrated circuits includes a factory interface. A screen print processing system is coupled with the factory interface. A laser scribe apparatus is coupled with the factory interface. A plasma etch chamber is coupled with the factory interface.

BRIEF DESCRIPTION OF THE DRAWINGS

FIGS. 4A1 and 4B1 illustrate a top plan view and a cross-sectional view, respectively, of a dicing mask screen printed with a dicing pattern therein, in accordance with a first embodiment of the present invention.

FIGS. 4A2 and 4B2 illustrate a top plan view and a cross-sectional view, respectively, of a dicing mask screen printed with a dicing pattern therein, in accordance with a second embodiment of the present invention.

DETAILED DESCRIPTION

Figure 1:
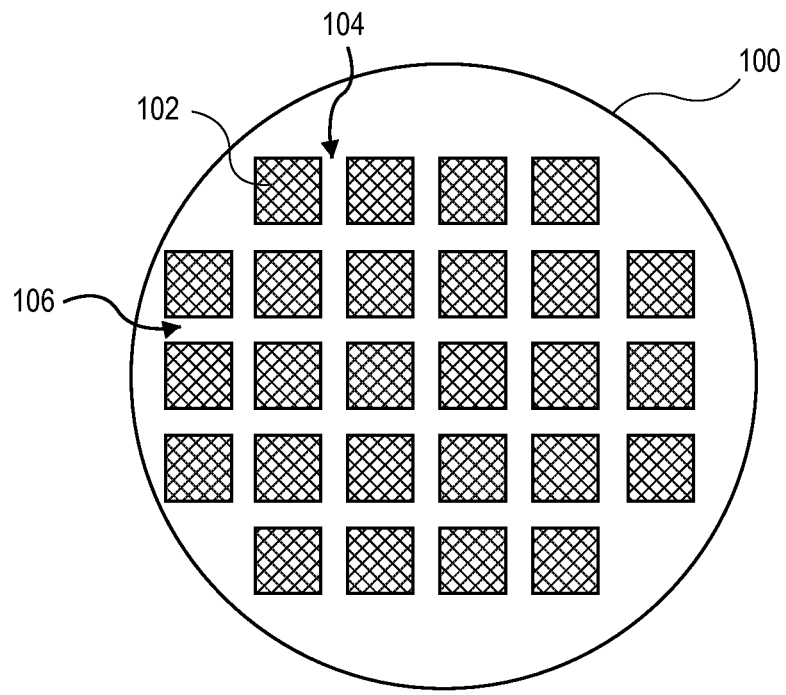
FIG. 1 illustrates a top plan of a semiconductor wafer to be diced, in accordance with an embodiment of the present invention.

Methods of dicing semiconductor wafers, each wafer having a plurality of integrated circuits thereon, are described. In the following description, numerous specific details are set forth, such as femtosecond-based laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A wafer or substrate dicing process involving an initial screen print mask application and subsequent hybrid laser scribe and plasma etch process may be implemented for die singulation. The laser scribe portion of the process may be used to cleanly remove a mask layer, organic and inorganic dielectric layers, any metals, test structures and device layers. The laser etch process may then be terminated upon exposure of, or partial etch of, the wafer or substrate. The plasma etch portion of the dicing process may then be employed to etch through the exposed bulk of the wafer or substrate, such as through bulk single crystalline silicon, to yield die or chip singulation or dicing. The mask applied during the initial screen printing may be used to protect integrated circuits on the wafer or substrate during the plasma etch portion of the singulation process.

More specifically, one or more embodiments are directed to screen printing a mask for wafer dicing, e.g., to blanket or pattern coat a protective organic and/or inorganic polymer on a silicon device wafer. Conventionally, in semiconductor dicing, a dielectric/polymer mask is deposited using a spin-coat or chemical vapor deposition (CVD) method. Such approaches may not be readily applicable for forming masks of higher viscosity materials. In one embodiment, a polymer paste having a viscosity approximately in the range of 5000-50000 centiPoise is dispensed through stencil/polymer screen onto silicon wafers. The resulting mask material is used as a protective layer in a hybrid laser scribing and plasma etch wafer dicing process.

More generally, conventional wafer dicing approaches include diamond saw cutting based on a purely mechanical separation, initial laser scribing and subsequent diamond saw dicing, or nanosecond or picosecond laser dicing. For thin wafer or substrate singulation, such as 50 microns thick (or even thicker/thinner) bulk silicon singulation, the conventional approaches have yielded only poor process quality. Some of the challenges that may be faced when singulating die from thin wafers or substrates may include microcrack formation or delamination between different dielectric and/or metal layers, chipping of inorganic dielectric layers, retention of strict kerf width control, or precise ablation depth control. Embodiments of the present invention include a hybrid laser scribing and plasma etching die singulation approach that may be useful for overcoming one or more of the above challenges.

In accordance with an embodiment of the present invention, a combination of laser scribing (e.g., femtosecond-based) and plasma etching is used to dice a semiconductor wafer into individualized or singulated integrated circuits. In one embodiment, femtosecond-based laser scribing is used as an essentially, if not totally, non-thermal process. For example, the femtosecond-based laser scribing may be localized with no or negligible heat damage zone. In an embodiment, approaches herein are used to singulated integrated circuits having ultra-low k films. With convention dicing, saws may need to be slowed down to accommodate such low k films. Furthermore, semiconductor wafers are now often thinned prior to dicing. As such, in an embodiment, a combination of mask patterning and partial wafer scribing with a femtosecond-based laser, followed by a plasma etch process, is now practical. In one embodiment, direct writing with laser can eliminate need for a lithography patterning operation of a photo-resist layer and can be implemented with very little cost. In one embodiment, through-via type silicon etching is used to complete the dicing process in a plasma etching environment.

Figure 2:
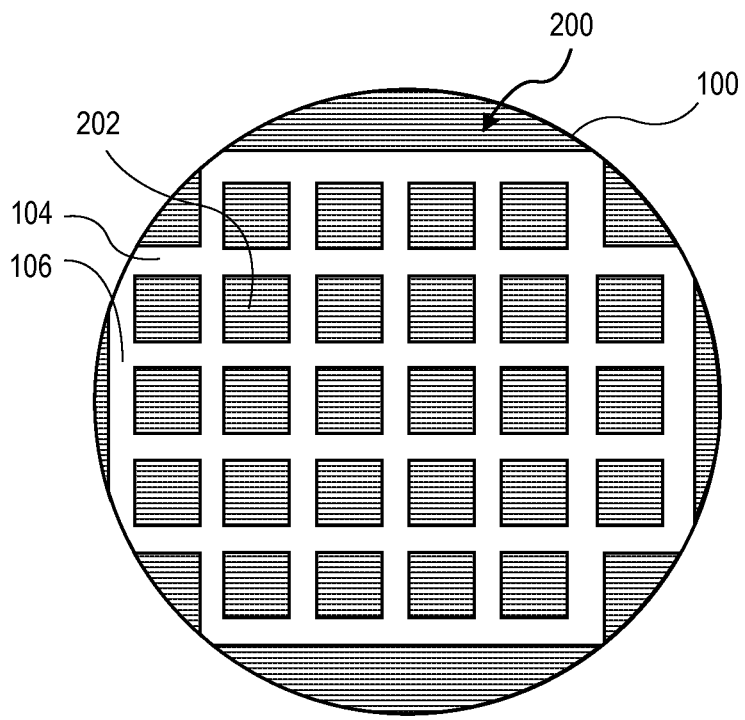
FIG. 2 illustrates a top plan of a semiconductor wafer to be diced that has a dicing mask formed thereon, in accordance with an embodiment of the present invention.

Thus, in an aspect of the present invention, a combination of screen print mask application, femtosecond-based laser scribing and plasma etching may be used to dice a semiconductor wafer into singulated integrated circuits. FIG. 1 illustrates a top plan of a semiconductor wafer to be diced, in accordance with an embodiment of the present invention. FIG. 2 illustrates a top plan of a semiconductor wafer to be diced that has a dicing mask formed thereon, in accordance with an embodiment of the present invention.

Referring to FIG. 1, a semiconductor wafer 100 has a plurality of regions 102 that include integrated circuits. The regions 102 are separated by vertical streets 104 and horizontal streets 106. The streets 104 and 106 are areas of semiconductor wafer that do not contain integrated circuits (but may include similar materials thereof) and are designed as locations along which the wafer will be diced. Some embodiments of the present invention involve the use of a combination femtosecond-based laser scribe and plasma etch technique to cut trenches through the semiconductor wafer along the streets such that the dice are separated into individual chips or die. Since both a laser scribe and a plasma etch process are crystal structure orientation independent, the crystal structure of the semiconductor wafer to be diced may be immaterial to achieving a vertical trench through the wafer.

Referring to FIG. 2, the semiconductor wafer 100 has a mask 200 screen-printed upon the semiconductor wafer 100. The mask 200 has a pattern that provides coverage of the regions 102 with mask portions 202, but exposes the streets 104 and 106. In one embodiment, the mask 200 is screen-printed in the pattern of the semiconductor wafer 100. In another embodiment, the mask 200 is formed as a blanket layer and is subsequently patterned to expose the streets 104 and 106 by laser ablation. In either case, the streets 104 and 106 are then removed by laser ablation. The regions 202 of the mask 200 are positioned such that during a etching process performed subsequent to street 104 and 106 ablation, the integrated circuits are not degraded by the etch process.

Figure 3:
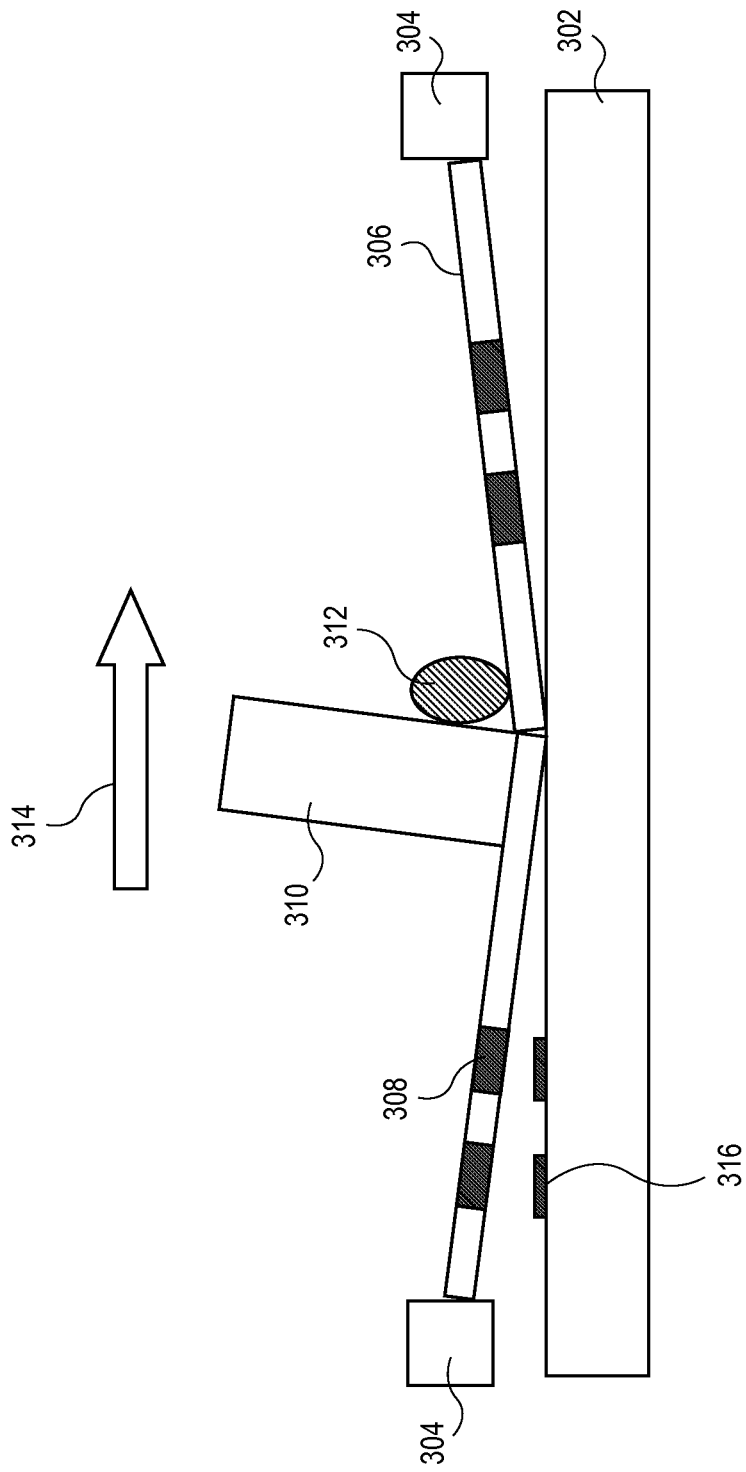
FIG. 3 is a schematic illustrating a cross-sectional view of a screen print process for forming a dicing mask, in accordance with an embodiment of the present invention.

As a general example, FIG. 3 is a schematic illustrating a cross-sectional view of a screen print process for forming a dicing mask, in accordance with an embodiment of the present invention. Referring to FIG. 3, screen printing a protective mask layer involves providing a screen frame 304 with screen 306 over a substrate 302. The screen has a pattern which may include fine features 308. A squeegee 310 is used to apply mask material 312 in a direction 314, ultimately forming a mask pattern 316 on the substrate 302. In a particular embodiment, the squeegee 310 aids in sheering the printing paste 312 on the screen 306.

In a first more particular example, FIGS. 4A1 and 4B1 illustrate a top plan view and a cross-sectional view, respectively, of a dicing mask screen printed with a dicing pattern therein, in accordance with a first embodiment of the present invention.

Referring to FIGS. 4A1 and 4B1, a patterned mask 408 is screen-printed above a semiconductor wafer 404. The patterned mask 408 covers integrated circuits 406 of the semiconductor wafer 404, but the pattern leaves exposed streets 407 of the semiconductor wafer 404. That is, the patterned mask 408 has spacings 403 therein that expose streets 407 of the semiconductor wafer 404, but that covers the integrated circuits 406 of the semiconductor wafer 404.

In a second more particular example, FIGS. 4A2 and 4B2 illustrate a top plan view and a cross-sectional view, respectively, of a dicing mask screen printed with a dicing pattern therein, in accordance with a second embodiment of the present invention.

Referring to FIGS. 4A2 and 4B2, a blanket mask 402 is screen-printed above a semiconductor wafer 404. The blanket mask 402 covers integrated circuits 406 of the semiconductor wafer 404 as well as streets 407 of the semiconductor wafer 404. That is, the blanket mask 402 essentially covers the entire semiconductor wafer 404.

In an embodiment, in both cases (i.e., FIGS. 4A1/4B1 or 4A2/4B2) the screen printed mask 408/402 has no bubbles or other defects following screen printing. In one such embodiment, any protruding metal bumps are uniformly coated. In an embodiment, the screen printed mask 408/402 has a thickness approximately in the range of 20-90 µm. In an embodiment, prior to screen printing, the screen printed mask 408/402 is baked by thermal heating at a temperature of less than approximately 100 degrees Celsius, and the baking is performed to remove any solvents used in the screen print process. It is to be appreciated that other "baking" approaches that may be suitable include infra-red (IR) baking, convective baking, or IR/convective hybrid baking.

In an embodiment, in both cases (i.e., FIGS. 4A1/4B1 or 4A2/4B2) the screen printed mask 408/402 is a water-soluble mask layer. In an embodiment, the water-soluble mask layer is readily dissolvable in an aqueous media. For example, in one embodiment, the water-soluble mask layer is composed of a material that is soluble in one or more of an alkaline solution, an acidic solution, or in deionized water. In an embodiment, the water-soluble mask layer maintains its water solubility upon exposure to a heating process, such as heating approximately in the range of 50-160 degrees Celsius. For example, in one embodiment, the water-soluble mask layer is soluble in aqueous solutions following exposure to chamber conditions used in a laser and plasma etch singulation process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble mask layer has an etch rate in an aqueous solution approximately in the range of 1-15 microns per minute and, more particularly, approximately 1.3 microns per minute.

In an embodiment, contrasting the examples described in association with FIGS. 4A1/4B1 versus 4A2/4B2), in screen printing a water-soluble mask layer already having the pattern of the streets of the semiconductor wafer below, a higher viscosity material layer may need to be deposited to avoid bleeding of the pattern. For example, in a particular embodiment, the patterned screen printed mask 408 has a viscosity approximately in the range of 10,000-80,000 centiPoise. By contrast, a lower, more typical viscosity material may be screen printed in the case of a blanket screen-printing process. For example, in a particular embodiment, the blanket screen printed mask 402 has a viscosity approximately in the range of 2000-10,000 centiPoise.

In another contrasting example, since the patterned mask 408 already exposes streets 407, the mask material does not necessarily need to be subjected to laser ablation, as is described below for street 407 removal. By contrast, the blanket mask layer 402 is, in one embodiment, patterned in the same laser ablation process used to remove streets 407. As such, in a particular embodiment, in the case of a patterned mask 408, a thicker mask layer may be used (e.g., to provide additional protection through plasma etching) than compared with a blanket deposited mask layer 402.

In an embodiment, in both cases (i.e., FIGS. 4A1/4B1 or 4A2/4B2) the screen printed mask 408/402 is a UV-curable mask layer instead of a water-soluble mask layer. In an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

Figure 4C:
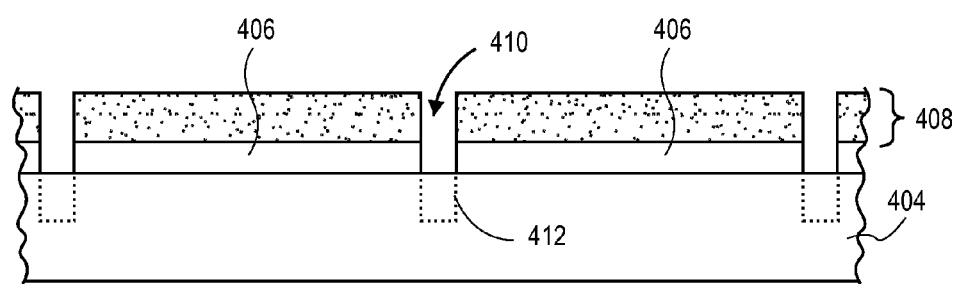
FIGS. 4C and 4D illustrate cross-sectional views of a semiconductor wafer including a plurality of integrated circuits during performing of a method of dicing the semiconductor wafer, in accordance with an embodiment of the present invention.
Figure 4D:
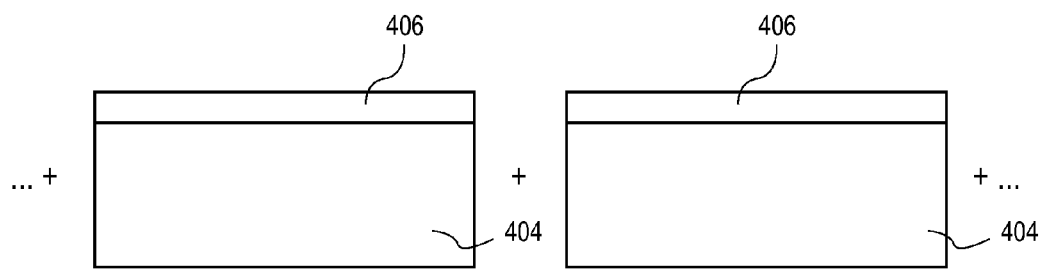

Whether initiating from the operation described in association with FIGS. 4A1/4B1 or 4A2/4B2, FIGS. 4C and 4D illustrate cross-sectional views of a semiconductor wafer including a plurality of integrated circuits during performing of a method of dicing the semiconductor wafer, in accordance with an embodiment of the present invention.

Referring to FIG. 4C, if proceeding from the process described in association with FIG. 4B1, a laser scribing process is used for laser ablating the streets 407 to expose regions 410 of the semiconductor wafer 404 between the integrated circuits 406. However, if proceeding from the process described in association with FIG. 4B2, a laser scribing process is used for laser ablating both portions of the mask layer 402 (e.g., to form patterned mask layer 408) and the streets 407, exposing regions 410 of the semiconductor wafer 404 between the integrated circuits 406. In either case, the laser scribing process is used to remove the material of the streets 407 originally formed between the integrated circuits 406. In accordance with an embodiment of the present invention, the laser scribing process further forms trenches 412 partially into the regions of the semiconductor wafer 404 between the integrated circuits 406, as depicted in FIG. 4C.

Referring to FIG. 4D, the semiconductor wafer 404 is etched through the exposed regions 410 of the semiconductor wafer 404 to singulate the integrated circuits 406. The patterned mask 408 protects the integrated circuits 406 during the plasma etching. In an embodiment, the patterned mask 408 is removed subsequent to plasma etching the semiconductor wafer 404. In one such embodiment, the patterned mask 408 is a water-soluble mask and is ultimately removed with an aqueous solution. In a particular embodiment, the aqueous solution is a cold or hot deionized water solution.

In an embodiment, semiconductor wafer or substrate 404 is composed of a material suitable to withstand a fabrication process and upon which semiconductor processing layers may suitably be disposed. For example, in one embodiment, semiconductor wafer or substrate 404 is composed of a group IV-based material such as, but not limited to, crystalline silicon, germanium or silicon/germanium. In a specific embodiment, providing semiconductor wafer 404 includes providing a monocrystalline silicon substrate. In a particular embodiment, the monocrystalline silicon substrate is doped with impurity atoms. In another embodiment, semiconductor wafer or substrate 404 is composed of a III-V material such as, e.g., a III-V material substrate used in the fabrication of light emitting diodes (LEDs).

In an embodiment, semiconductor wafer or substrate 404 has disposed thereon or therein, as a portion of the integrated circuits 406, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits 406. Materials making up the streets 407 may be similar to or the same as those materials used to form the integrated circuits 406. For example, streets 407 may be composed of layers of dielectric materials, semiconductor materials, and metallization. In one embodiment, one or more of the streets 407 includes test devices similar to the actual devices of the integrated circuits 406.

In an embodiment, patterning the streets 407 (and possibly the mask 402) with the laser scribing process includes using a laser having a pulse width in the femtosecond range. Specifically, a laser with a wavelength in the visible spectrum plus the ultra-violet (UV) and infra-red (IR) ranges (totaling a broadband optical spectrum) may be used to provide a femtosecond-based laser, i.e., a laser with a pulse width on the order of the femtosecond ($10^{-15}$ seconds). In one embodiment, ablation is not, or is essentially not, wavelength dependent and is thus suitable for complex films such as films of the mask 402, the streets 407 and, possibly, a portion of the semiconductor wafer or substrate 404.

Figure 5:
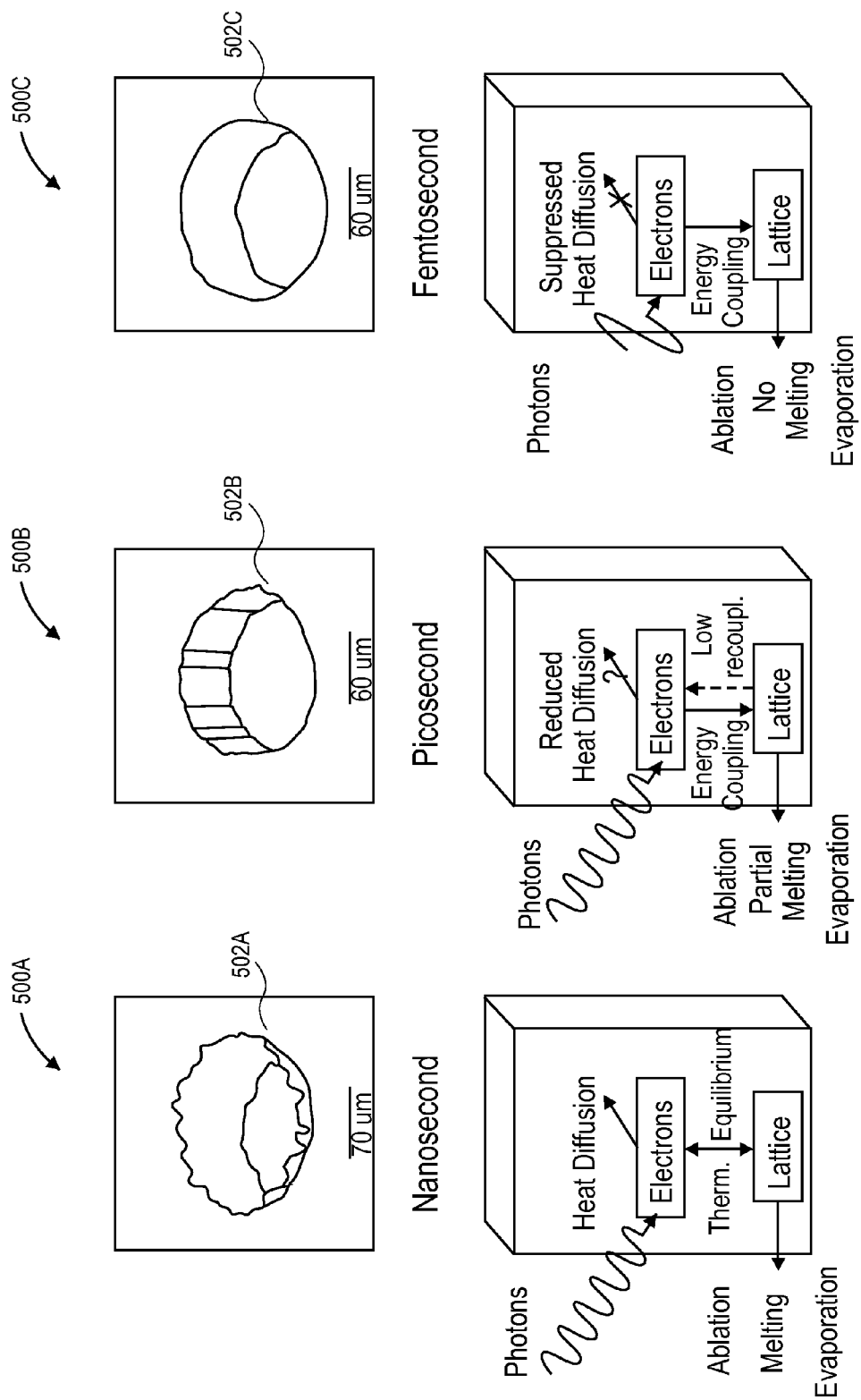
FIG. 5 illustrates the effects of using a laser pulse in the femtosecond range versus longer pulse times, in accordance with an embodiment of the present invention.

FIG. 5 illustrates the effects of using a laser pulse in the femtosecond range versus longer frequencies, in accordance with an embodiment of the present invention. Referring to FIG. 5, by using a laser with a pulse width in the femtosecond range heat damage issues are mitigated or eliminated (e.g., minimal to no damage 502C with femtosecond processing of a via 500C) versus longer pulse widths (e.g., damage 502B with picosecond processing of a via 500B and significant damage 502A with nanosecond processing of a via 500A). The elimination or mitigation of damage during formation of via 500C may be due to a lack of low energy recoupling (as is seen for picosecond-based laser ablation) or thermal equilibrium (as is seen for nanosecond-based laser ablation), as depicted in FIG. 5.

Laser parameters selection, such as pulse width, may be critical to developing a successful laser scribing and dicing process that minimizes chipping, microcracks and delamination in order to achieve clean laser scribe cuts. The cleaner the laser scribe cut, the smoother an etch process that may be performed for ultimate die singulation. In semiconductor device wafers, many functional layers of different material types (e.g., conductors, insulators, semiconductors) and thicknesses are typically disposed thereon. Such materials may include, but are not limited to, organic materials such as polymers, metals, or inorganic dielectrics such as silicon dioxide and silicon nitride.

A street between individual integrated circuits disposed on a wafer or substrate may include the similar or same layers as the integrated circuits themselves. For example, FIG. 6 illustrates a cross-sectional view of a stack of materials that may be used in a street region of a semiconductor wafer or substrate, in accordance with an embodiment of the present invention.

Figure 6:
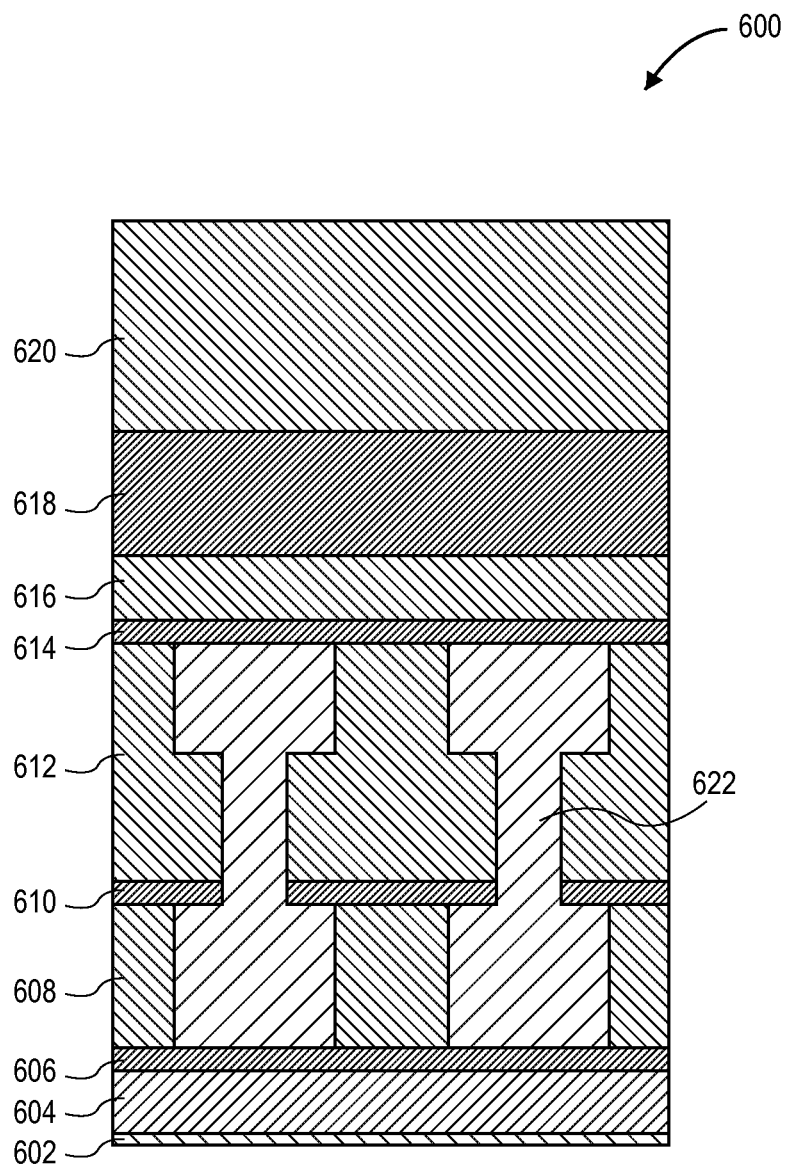
FIG. 6 illustrates a cross-sectional view of a stack of materials that may be used in a street region of a semiconductor wafer or substrate, in accordance with an embodiment of the present invention.

Referring to FIG. 6, a street region 600 includes the top portion 602 of a silicon substrate, a first silicon dioxide layer 604, a first etch stop layer 606, a first low K dielectric layer 608 (e.g., having a dielectric constant of less than the dielectric constant of 4.0 for silicon dioxide), a second etch stop layer 610, a second low K dielectric layer 612, a third etch stop layer 614, an undoped silica glass (USG) layer 616, and a second silicon dioxide layer 618. In association with one embodiment of the present invention (in the case of a blanket screen printed mask), a screen-printed mask 620, e.g., composed of a water soluble film is depicted. Copper metallization 622 is disposed between the first and third etch stop layers 606 and 614 and through the second etch stop layer

610. In a specific embodiment, the first, second and third etch stop layers 606, 610 and 614 are composed of silicon nitride, while low K dielectric layers 608 and 612 are composed of a carbon-doped silicon oxide material.

Figures 7, 8:
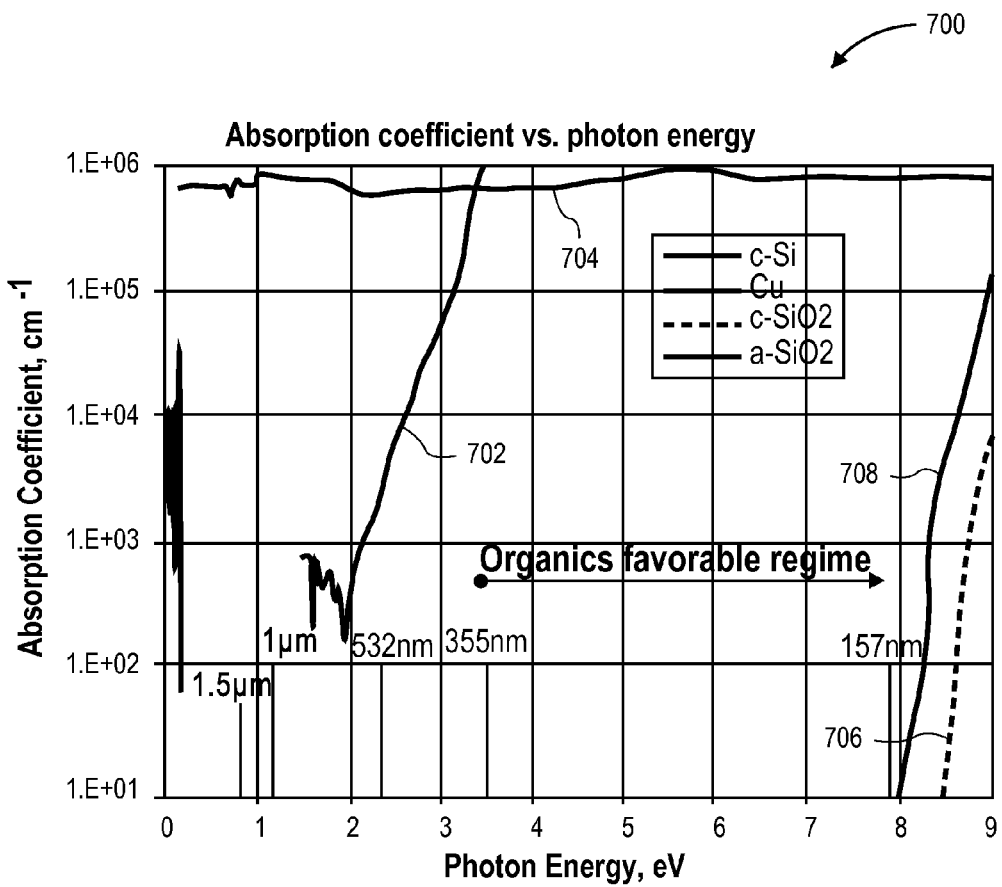
FIG. 7 includes a plot of absorption coefficient as a function of photon energy for crystalline silicon (c-Si), copper (Cu), crystalline silicon dioxide (c-SiO2), and amorphous silicon dioxide (a-SiO2), in accordance with an embodiment of the present invention.
FIG. 8 is an equation showing the relationship of laser intensity for a given laser as a function of laser pulse energy, laser pulse width, and laser beam radius.

Under conventional laser irradiation (such as nanosecond-based or picosecond-based laser irradiation), the materials of street 600 behave quite differently in terms of optical absorption and ablation mechanisms. For example, dielectrics layers such as silicon dioxide, is essentially transparent to all commercially available laser wavelengths under normal conditions. By contrast, metals, organics (e.g., low K materials) and silicon can couple photons very easily, particularly in response to nanosecond-based or picosecond-based laser irradiation. For example, FIG. 7 includes a plot 700 of absorption coefficient as a function of photon energy for crystalline silicon (c-Si, 702), copper (Cu, 704), crystalline silicon dioxide (c-SiO2, 706), and amorphous silicon dioxide (a-SiO2, 708), in accordance with an embodiment of the present invention. FIG. 8 is an equation 800 showing the relationship of laser intensity for a given laser as a function of laser pulse energy, laser pulse width, and laser beam radius.

Using equation 800 and the plot 700 of absorption coefficients, in an embodiment, parameters for a femtosecond laser-based process may be selected to have an essentially common ablation effect on the inorganic and organic dielectrics, metals, and semiconductors even though the general energy absorption characteristics of such materials may differ widely under certain conditions. For example, the absorptivity of silicon dioxide is non-linear and may be brought more in-line with that of organic dielectrics, semiconductors and metals under the appropriate laser ablation parameters. In one such embodiment, a high intensity and short pulse width femtosecond-based laser process is used to ablate a stack of layers including a silicon dioxide layer and one or more of an organic dielectric, a semiconductor, or a metal. In a specific embodiment, pulses of approximately less than or equal to 400 femtoseconds are used in a femtosecond-based laser irradiation process to remove a screen-printed mask (optional, i.e., in the blanket-printed case), a street, and a portion of a silicon substrate.

By contrast, if non-optimal laser parameters are selected, in a stacked structure that involves two or more of an inorganic dielectric, an organic dielectric, a semiconductor, or a metal, a laser ablation process may cause delamination issues. For example, a laser penetrate through high bandgap energy dielectrics (such as silicon dioxide with an approximately of 9 eV bandgap) without measurable absorption. However, the laser energy may be absorbed in an underlying metal or silicon layer, causing significant vaporization of the metal or silicon layers. The vaporization may generate high pressures to lift-off the overlying silicon dioxide dielectric layer and potentially causing severe interlayer delamination and microcracking. In an embodiment, while picoseconds-based laser irradiation processes lead to microcracking and delaminating in complex stacks, femtosecond-based laser irradiation processes have been demonstrated to not lead to microcracking or delamination of the same material stacks.

In order to be able to directly ablate dielectric layers, ionization of the dielectric materials may need to occur such that they behave similar to a conductive material by strongly absorbing photons. The absorption may block a majority of the laser energy from penetrating through to underlying silicon or metal layers before ultimate ablation of the dielectric layer. In an embodiment, ionization of inorganic dielectrics is feasible when the laser intensity is sufficiently high to initiate photon-ionization and impact ionization in the inorganic dielectric materials.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1570 nanometers to 200 nanometers, although preferably in the range of 540 nanometers to 250 nanometers. In one embodiment, the laser and corresponding optical system provide a focal spot at the work surface approximately in the range of 3 microns to 15 microns, though preferably approximately in the range of 5 microns to 10 microns.

The spatial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 uJ to 100 uJ, although preferably approximately in the range of 1 uJ to 5 uJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably 1-2 passes. In one embodiment, the scribing depth in the work piece is approximately in the range of 5 microns to 50 microns deep, preferably approximately in the range of 10 microns to 20 microns deep. The laser may be applied either in a train of single pulses at a given pulse repetition rate or a train of pulse bursts. In an embodiment, the kerf width of the laser beam generated is approximately in the range of 2 microns to 15 microns, although in silicon wafer scribing/dicing preferably approximately in the range of 6 microns to 10 microns, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 400 femtoseconds of the laser having the wavelength of approximately less than or equal to 540 nanometers are used. However, in an alternative embodiment, dual laser wavelengths (e.g., a combination of an IR laser and a UV laser) are used.

Referring again to FIG. 4D, in accordance with an embodiment of the present invention, etching the semiconductor wafer 404 includes etching trenches formed with a femtosecond-based laser scribing process to ultimately etch entirely through semiconductor wafer 404. In one embodiment, the etching is performed by using a first etching operation to provide a bulk etch, and then performing a second etching operation to smooth exposed surfaces of the diced wafer or substrate. In one embodiment, a Bosch type etching process is used.

In an embodiment, etching the semiconductor wafer 404 includes using a plasma etching process. In one embodiment, a through-silicon via type etch process is used. For example, in a specific embodiment, the etch rate of the material of semiconductor wafer 404 is greater than 25 microns per minute. An ultra-high-density plasma source may be used for the plasma etching portion of the die singulation process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of etching silicon may be used. In an exemplary embodiment, a deep silicon etch is used to etch a single crystalline silicon substrate or wafer 404 at an etch rate greater than approximately 40% of conventional silicon etch rates while maintaining essentially precise profile control and virtually scallop-free sidewalls. In a specific embodiment, a through-silicon via type etch process is used. The etch process is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate. In an embodiment, the patterned screen-printed mask 408 protects the integrated circuits 406 during the plasma etching portion of the process, and is removed after the singulation process, as depicted in FIG. 4D.

Accordingly, referring again to FIGS. 4A1-4B1, 4A2-4B2 and 4C-4D, wafer dicing may be preformed by initial laser ablation through a mask layer (optional), through wafer streets (including metallization), and partially into a silicon substrate. The laser pulse width may be selected in the femtosecond range. Die singulation may then be completed by subsequent through-silicon deep plasma etching. A specific example of a materials stack for dicing is described below in association with FIGS. 9A-9D, in accordance with an embodiment of the present invention. In the example provided, a die attach film affixed to a backing tape is described. The backing tape may be part of a larger substrate support, as described in greater detail below in association with FIG. 13.

Figure 9A:
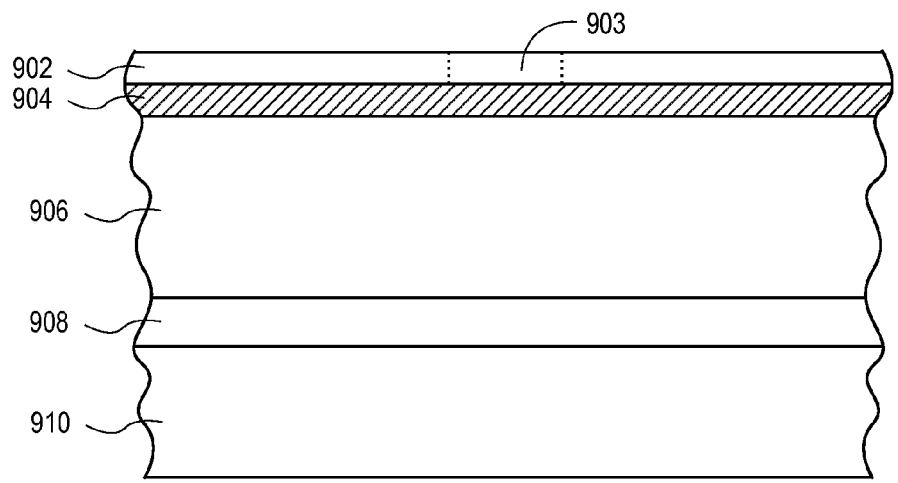
FIGS. 9A-9D illustrate cross-sectional views of various operations in a method of dicing a semiconductor wafer, in accordance with an embodiment of the present invention.

Referring to FIG. 9A, a materials stack for hybrid laser ablation and plasma etch dicing includes a screen-printed mask 902 (which may be blanket as shown, or patterned with an opening 903, as depicted by the dashed lines), a device layer 904, and a substrate 906. The screen-printed mask 902, device layer 904, and substrate 906 are disposed above a die attach film 908 which is affixed to a backing tape 910. In an embodiment, the screen-printed mask 902 is a water-soluble mask. The device layer 904 includes an inorganic dielectric layer (such as silicon dioxide) disposed above one or more metal layers (such as copper layers) and one or more low K dielectric layers (such as carbon-doped oxide layers). The device layer 904 also includes streets arranged between integrated circuits, the streets including the same or similar layers to the integrated circuits. The substrate 906 is a bulk single-crystalline silicon substrate.

In an embodiment, the bulk single-crystalline silicon substrate 906 is thinned from the backside prior to being affixed to the die attach film 908. The thinning may be performed by a backside grind process. In one embodiment, the bulk single-crystalline silicon substrate 906 is thinned to a thickness approximately in the range of 50-300 microns. It is important to note that, in an embodiment, the thinning is performed prior to a laser ablation and plasma etch dicing process. In an embodiment, the die attach film 908 (or any suitable substitute capable of bonding a thinned or thin wafer or substrate to the backing tape 910) has a thickness of approximately 20 microns.

Figure 9B:
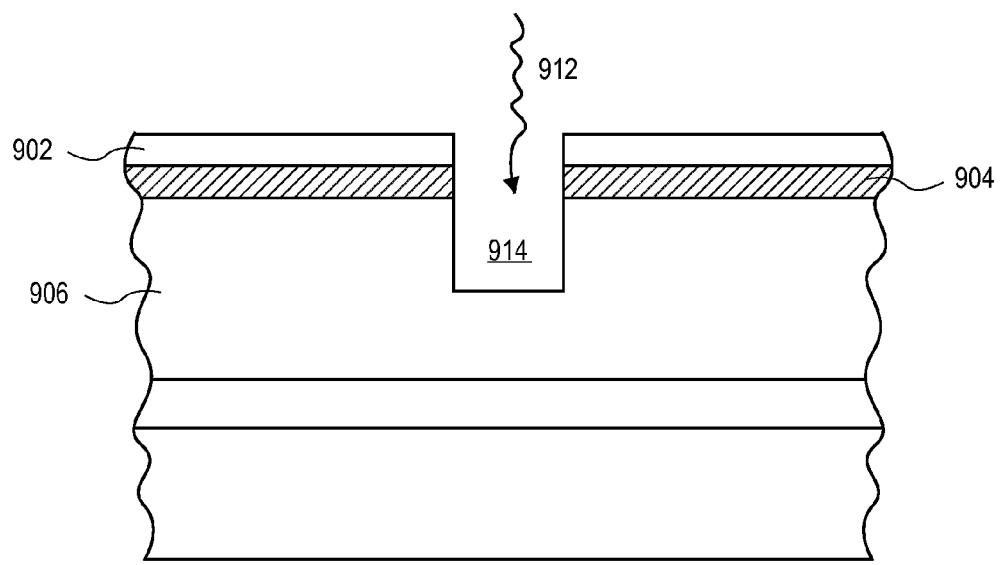
Figure 9C:
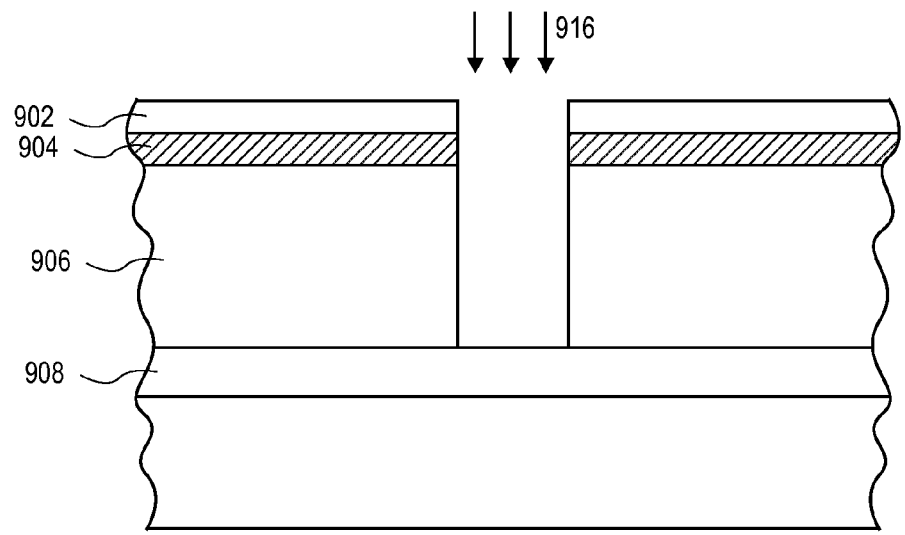

Referring to FIG. 9B, the screen-printed mask 902 (if present at location 903), the device layer 904 and a portion of the substrate 906 are patterned with a femtosecond-based laser scribing process 912 to form trenches 914 in the substrate 906. Referring to FIG. 9C, a through-silicon deep plasma etch process 916 is used to extend the trench 914 down to the die attach film 908, exposing the top portion of the die attach film 908 and singulating the silicon substrate 906. The device layer 904 is protected by the screen-printed mask 902 during the through-silicon deep plasma etch process 916.

Figure 9D:
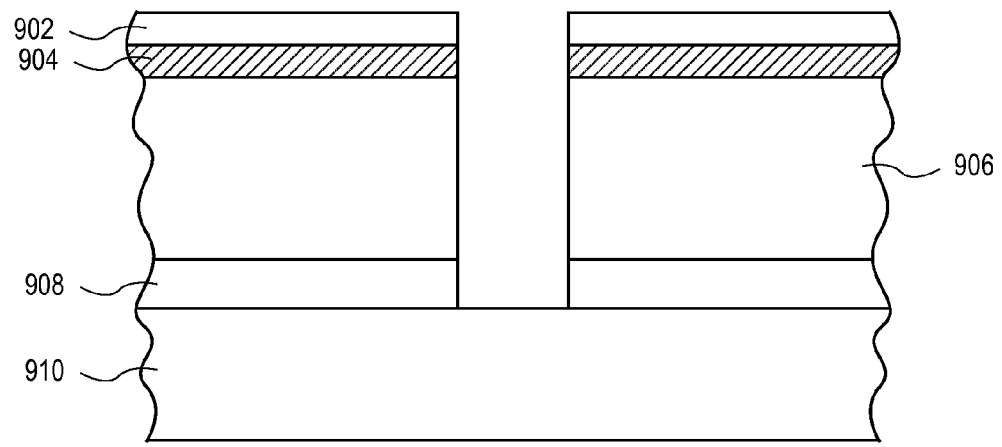

Referring to FIG. 9D, the singulation process may further include patterning the die attach film 908, exposing the top portion of the backing tape 910 and singulating the die attach film 908. In an embodiment, the die attach film is singulated by a laser process or by an etch process. Further embodiments may include subsequently removing the singulated portions of substrate 906 (e.g., as individual integrated circuits) from the backing tape 910. In one embodiment, the singulated die attach film 908 is retained on the back sides of the singulated portions of substrate 906. Other embodiments may include removing the screen-printed mask 902 from the device layer 904. In an alternative embodiment, e.g., in the case that substrate 906 is thinner than approximately 50 microns, the laser ablation process 912 is used to completely singulate substrate 906 without the use of an additional plasma process.

Subsequent to singulating the die attach film 908, in an embodiment, the screen-printed mask 902 is removed from the device layer 904. In an embodiment, the singulated integrated circuits are removed from the backing tape 910 for packaging. In one such embodiment, the patterned die attach film 908 is retained on the backside of each integrated circuit and included in the final packaging. However, in another embodiment, the patterned die attach film 908 is removed during or subsequent to the singulation process.

Referring again to FIGS. 4B1, 4B2, 4C and 4D, the plurality of integrated circuits 406 may be separated by streets 407 having a width of approximately 10 microns or smaller. The use of a femtosecond-based laser scribing approach, at least in part due to the tight profile control of the laser, may enable such compaction in a layout of integrated circuits. For example, FIG. 10 illustrates compaction on a semiconductor wafer or substrate achieved by using narrower streets versus conventional dicing which may be limited to a minimum width, in accordance with an embodiment of the present invention.

Figure 10:
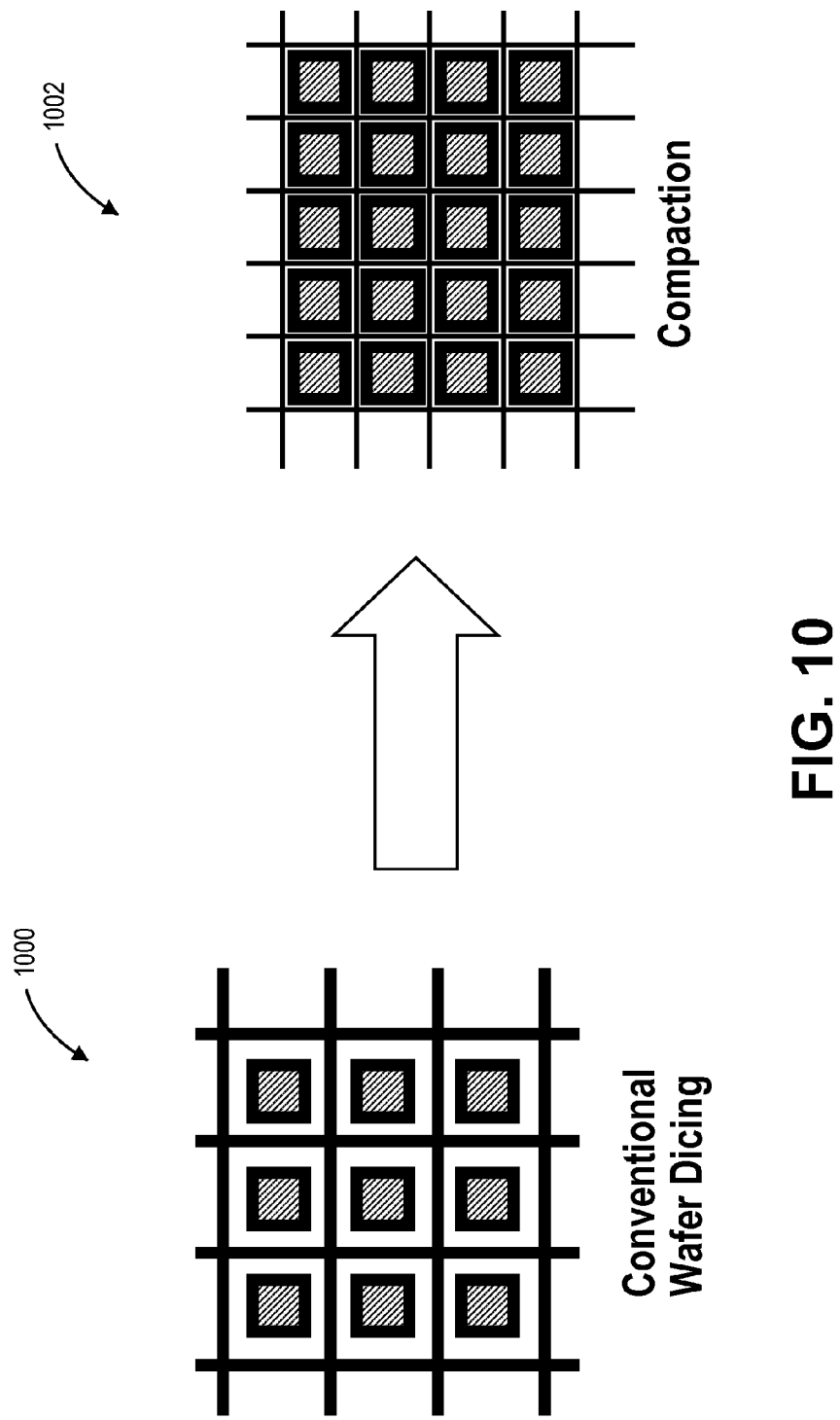
FIG. 10 illustrates compaction on a semiconductor wafer achieved by using narrower streets versus conventional dicing which may be limited to a minimum width, in accordance with an embodiment of the present invention.

Referring to FIG. 10, compaction on a semiconductor wafer is achieved by using narrower streets (e.g., widths of approximately 10 microns or smaller in layout 1002) versus conventional dicing which may be limited to a minimum width (e.g., widths of approximately 70 microns or larger in layout 1000). It is to be understood, however, that it may not always be desirable to reduce the street width to less than 10 microns even if otherwise enabled by a femtosecond-based laser scribing process. For example, some applications may require a street width of at least 40 microns in order to fabricate dummy or test devices in the streets separating the integrated circuits.

Figure 11:
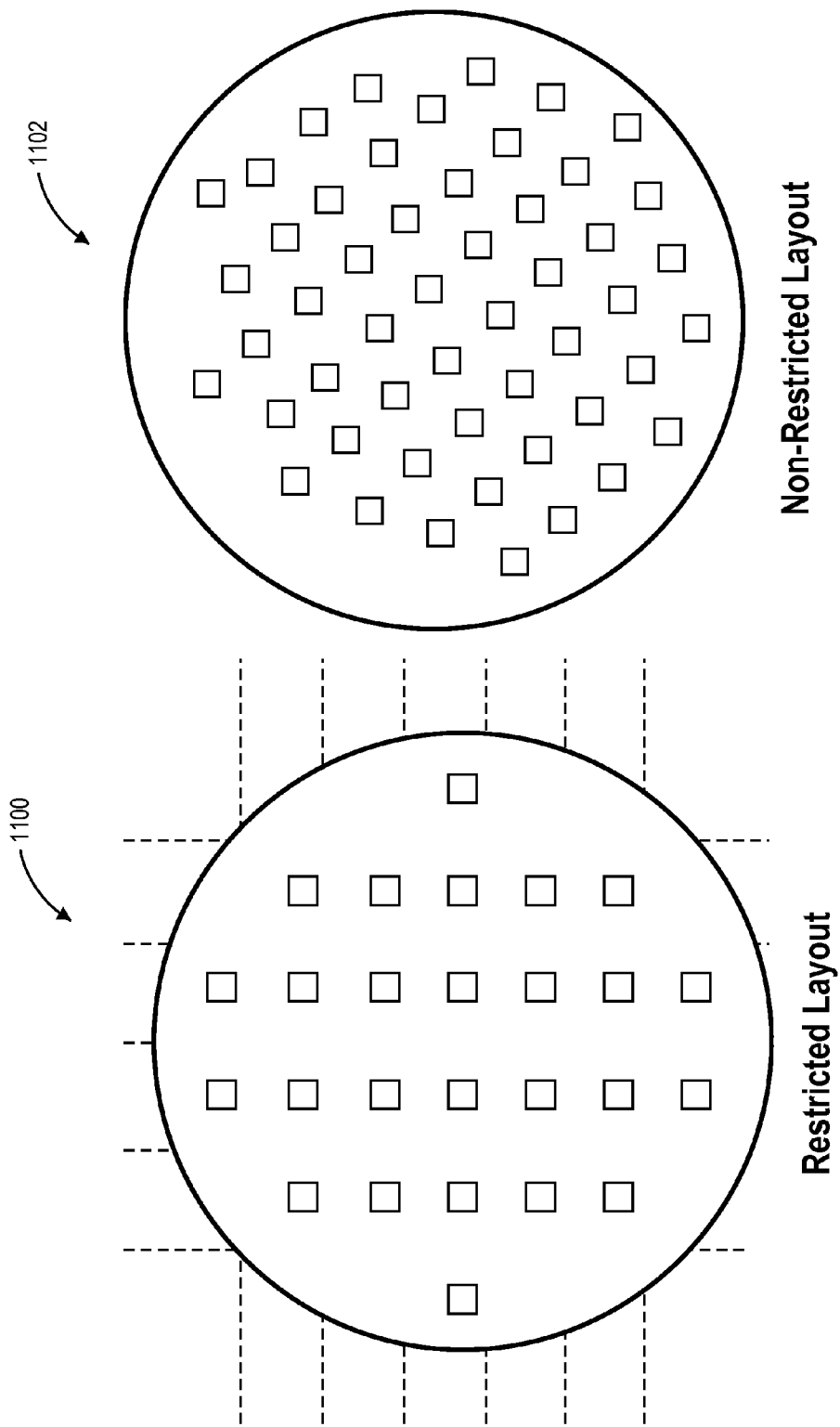
FIG. 11 illustrates freeform integrated circuit arrangement allowing denser packing and, hence, more die per wafer versus grid alignment approaches, in accordance with an embodiment of the present invention.

Referring again to FIGS. 4B1, 4B2, 4C and 4D, the plurality of integrated circuits 406 may be arranged on semiconductor wafer or substrate 404 in a non-restricted layout. For example, FIG. 11 illustrates freeform integrated circuit arrangement allowing denser packing. The denser packing may provide for more die per wafer versus grid alignment approaches, in accordance with an embodiment of the present invention. Referring to FIG. 11, a freeform layout (e.g., a non-restricted layout on semiconductor wafer or substrate 1102) allows denser packing and hence more die per wafer versus grid alignment approaches (e.g., a restricted layout on semiconductor wafer or substrate 1100). In an embodiment, the speed of the laser ablation and plasma etch singulation process is independent of die size, layout or the number of streets.

A single process tool may be configured to perform many or all of the operations in a hybrid laser ablation and plasma etch singulation process. For example, FIG. 12 illustrates a block diagram of a tool layout for laser and plasma dicing of wafers or substrates, in accordance with an embodiment of the present invention.

Figure 12:
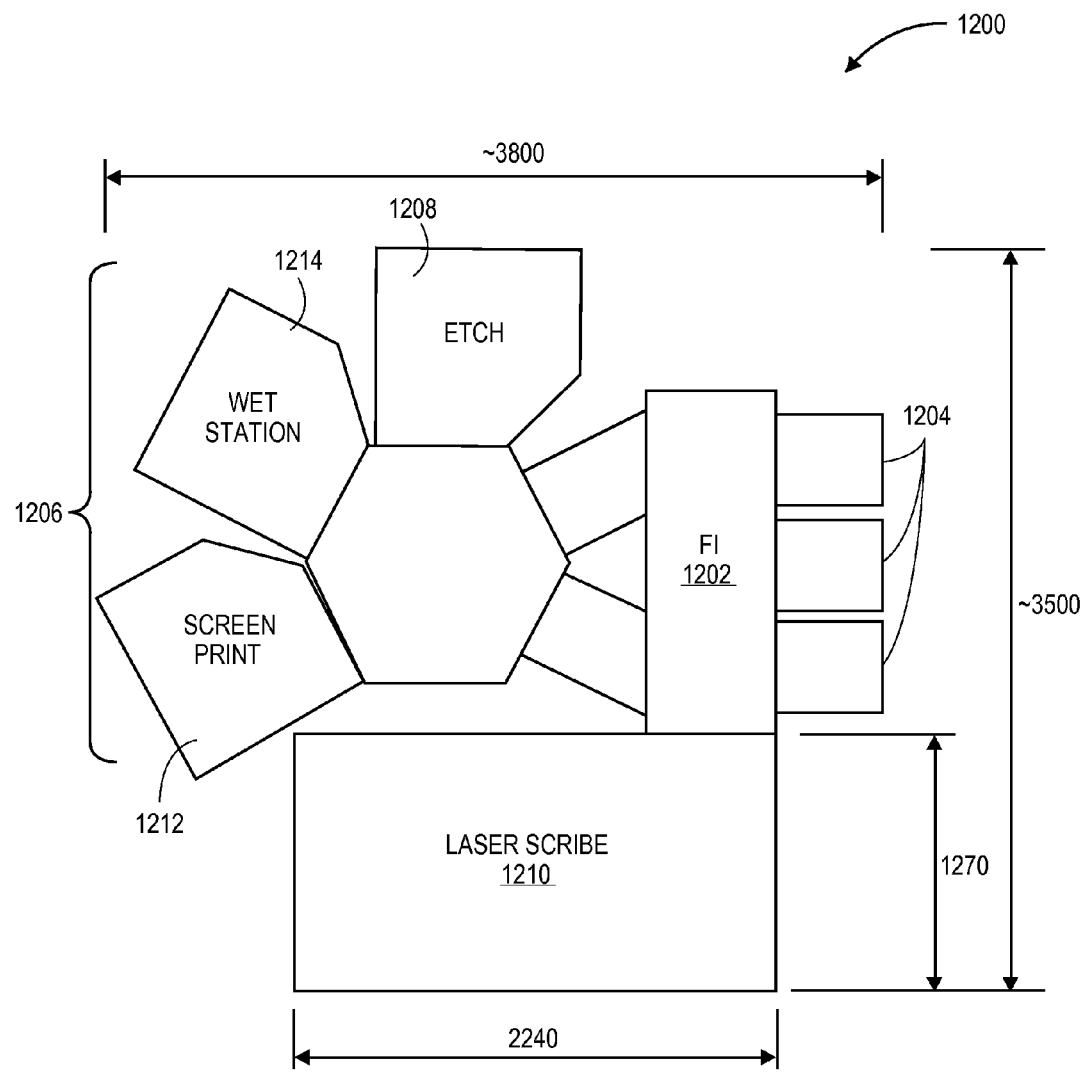
FIG. 12 illustrates a block diagram of a tool layout for laser and plasma dicing of wafers or substrates, in accordance with an embodiment of the present invention.

Referring to FIG. 12, a process tool 1200 includes a factory interface 1202 (FI) having a plurality of load locks 1204 coupled therewith. A cluster tool 1206 is coupled with the factory interface 1202. The cluster tool 1206 includes one or more plasma etch chambers, such as plasma etch chamber 1208. A laser scribe apparatus 1210 is also coupled to the factory interface 1202. The overall footprint of the process tool 1200 may be, in one embodiment, approximately 3500 millimeters (3.5 meters) by approximately 3800 millimeters (3.8 meters), as depicted in FIG. 12.

In an embodiment, the laser scribe apparatus 1210 houses a femtosecond-based laser. The femtosecond-based laser is suitable for performing a laser ablation portion of a hybrid laser and etch singulation process, such as the laser abalation processes described above. In one embodiment, a moveable stage is also included in laser scribe apparatus 1200, the moveable stage configured for moving a wafer or substrate (or a carrier thereof) relative to the femtosecond-based laser. In a specific embodiment, the femtosecond-based laser is also moveable. The overall footprint of the laser scribe apparatus 1210 may be, in one embodiment, approximately 2240 millimeters by approximately 1270 millimeters, as depicted in FIG. 12.

In an embodiment, the one or more plasma etch chambers 1208 is configured for etching a wafer or substrate through the gaps in a patterned mask to singulate a plurality of integrated circuits. In one such embodiment, the one or more plasma etch chambers 1208 is configured to perform a deep silicon etch process. In a specific embodiment, the one or more plasma etch chambers 1208 is an Applied Centura® Silvia™ Etch system, available from Applied Materials of Sunnyvale, Calif., USA. The etch chamber may be specifically designed for a deep silicon etch used to create singulate integrated circuits housed on or in single crystalline silicon substrates or wafers. In an embodiment, a high-density plasma source is included in the plasma etch chamber 1208 to facilitate high silicon etch rates. In an embodiment, more than one etch chamber is included in the cluster tool 1206 portion of process tool 1200 to enable high manufacturing throughput of the singulation or dicing process.

The factory interface 1202 may be a suitable atmospheric port to interface between an outside manufacturing facility with laser scribe apparatus 1210 and cluster tool 1206. The factory interface 1202 may include robots with arms or blades for transferring wafers (or carriers thereof) from storage units (such as front opening unified pods) into either cluster tool 1206 or laser scribe apparatus 1210, or both.

Cluster tool 1206 may include other chambers suitable for performing functions in a method of singulation. For example, in one embodiment, in place of an additional etch chamber, screen print processing system or chamber 1212 is included. The screen print processing system or chamber 1212 may be configured for mask formation on or above a device layer of a wafer or substrate prior to laser scribing of the wafer or substrate. In one such embodiment, the screen print processing system or chamber 1212 is suitable for forming a water-soluble layer having a blanket or street revealing pattern. In one embodiment, in place of an additional etch chamber, a wet station 1214 is included. The wet station may be suitable for cleaning residues and fragments, or for removing a water-soluble mask, subsequent to a laser scribe and plasma etch singulation process of a substrate or wafer. In an embodiment, a metrology station is also included as a component of process tool 1200.

In an aspect of the present invention, a thin substrate (e.g., with a thickness of approximately 100 microns or less) is accommodated in a hybrid laser ablation and plasma etching singulation process. In one such embodiment, the thin substrate is supported on a substrate carrier. It is to be appreciated, however, that a substrate carrier may be used for thicker substrates as well. In any case, in an example, FIG. 13 illustrates a plan view of a substrate carrier suitable for supporting a thin wafer during a singulation process, in accordance with an embodiment of the present invention.

Figure 13:
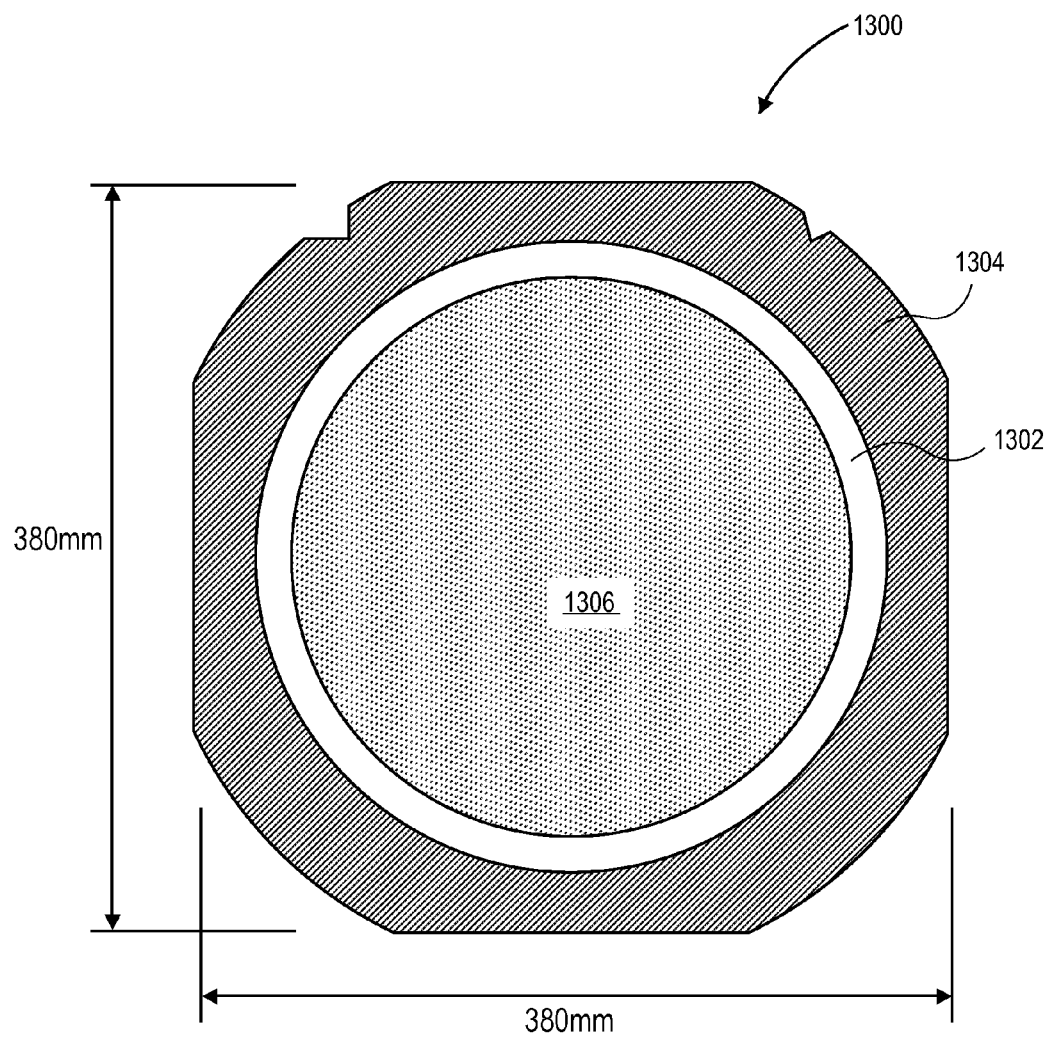
FIG. 13 illustrates a plan view of a substrate carrier suitable for supporting a thin wafer during a singulation process, in accordance with an embodiment of the present invention.

Referring to FIG. 13, a substrate carrier 1300 includes a layer of backing tape 1302 surrounded by a tape ring 1304. A wafer or substrate 1306, such as a thin wafer or substrate, is supported by the backing tape 1302 of the substrate carrier 1300. In one embodiment, the wafer or substrate 1306 is attached to the backing tape 1302 by a die attach film. In one embodiment, the tape ring 1304 is composed of stainless steel.

In an embodiment, a singulation process can be accommodated in a system sized to receive a substrate carrier such as the substrate carrier 1300. In one such embodiment, a system such as system 1200 can accommodate a thin wafer frame without impact on the system footprint that is otherwise sized to accommodate a substrate or wafer not supported by a substrate carrier. In one embodiment, system 1200, and hence screen print processing system or chamber 1212, is sized to accommodate 300 (or, possibly, 450) millimeter-in-diameter wafers or substrates. The same (or slightly modified) system can accommodate a wafer carrier approximately 380 millimeters in width by 380 millimeters in length, as depicted in FIG. 13. It is to be appreciated that wafer carriers of other shapes and dimensions may also be accommodated.

Figure 14:
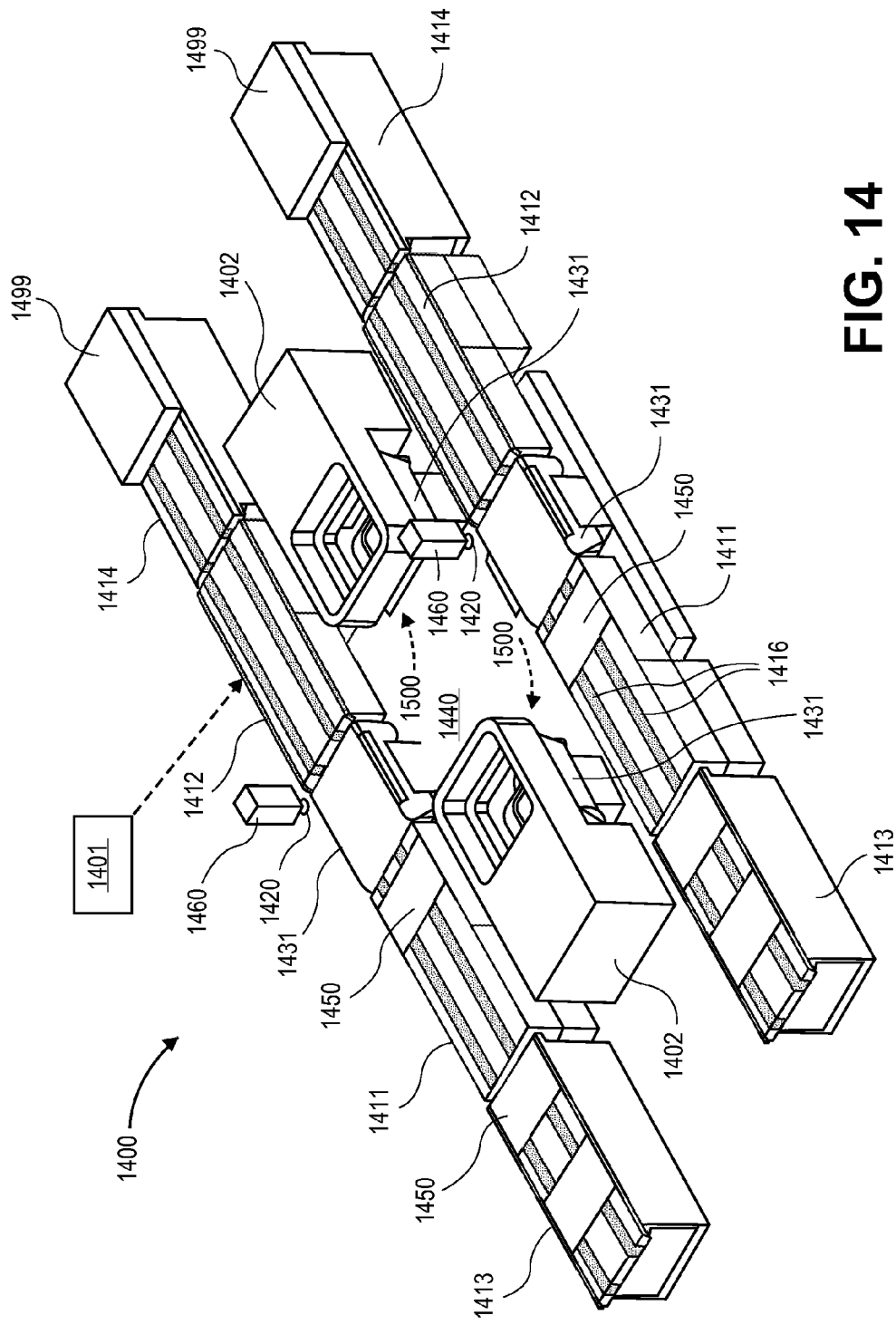
FIG. 14 is a schematic isometric view of a screen print processing system which may be used for implementing embodiments of the present invention.

In an exemplary illustration of a screen printing system which may be suitable for, or may be modified to accommodate, screen printing of semiconductor wafers on their own or as provided on a substrate carrier, FIG. 14 is a schematic isometric view of a screen print processing system which may be used for implementing embodiments of the present invention.

Referring to FIG. 14, a substrate screen printing processing system, or system 1400, has screen printing components, which are configured to screen print a patterned layer of material on a substrate 1450. In particular, the system 1400 provides printing heads 1402 each having a blade 1500. In one embodiment, the system 1400 generally includes two incoming conveyors 1411, an actuator assembly 1440, a plurality of processing nests 1431, a plurality of processing heads 1402, two outgoing conveyors 1412, and a system controller 1401.

The incoming conveyors 1411 are configured in a parallel processing configuration so that each can receive unprocessed substrates 1450 from an input device, such as an input conveyor 1413, and transfer each unprocessed substrate 1450 to a processing nest 1431 coupled to the actuator assembly 1440. Additionally, the outgoing conveyors 1412 are configured in parallel so that each can receive a processed substrate 1450 from a processing nest 1431 and transfer each processed substrate 1450 to a substrate removal device, such as an exit conveyor 1414.

In one embodiment, each exit conveyor 1414 is adapted to transport processed substrates 1450 through an oven 1499 to cure material deposited on the substrate 1450 via the processing heads 1402. The system 1400 may comprise other substrate processing modules requiring precise movement and positioning of the substrates for processing, e.g., by the use of one or more cameras for precision alignment.

Although the system 1400 is depicted having two printing heads 1402 and four processing nests 1431, the system 1400 may comprise additional printing heads 1402 and/or processing nests 1431 without departing from the scope of the present invention. In one embodiment, the incoming conveyor 1411 and outgoing conveyor 1412 include at least one belt 1416 to support and transport the substrates 1450 to a desired position within the system 1400 by use of an actuator (not shown) that is in communication with the system controller 1401. While FIG. 14 generally illustrates a two belt style substrate transferring system 1416, other types of transferring mechanisms may be used to perform the same substrate transferring and positioning functions without varying from the basic scope of the invention.

In one embodiment, the system 1400 also includes an inspection system 1460, which is adapted to locate and inspect the substrates 1450 before and after processing has been performed. The inspection system 1460 may include one or more cameras 1420 that are positioned to inspect a substrate 1450. The inspection system 1460 generally includes at least one camera 1420 (e.g., a charge coupled device (CCD) camera) and other electronic components that are able to locate, inspect, and communicate the results to the system controller 1401. In one embodiment, the inspection system 1460 locates the position of certain features of an incoming substrate 1450 and communicates the inspection results to the system controller 1401 for analysis of the orientation and position of the substrate 1450 to assist in the precise positioning of the substrate 1450 under a printing head 1402 prior to processing the substrate 1450. In one embodiment, the inspection system 1460 inspects the substrates 1450 so that damaged or mis-processed substrates can be removed from the production line. In one embodiment, the processing nests 1431 may each contain a lamp, or other similar optical radiation device, to illuminate the substrate 1450 positioned thereon so that it can be more easily inspected by the inspection system 1460.

In one embodiment, the two printing heads 1402 utilized in the system 1400 may be adapted to deposit material (e.g., a water soluble mask material) in a desired pattern on the surface of a substrate 1450 disposed on a processing nest 1431 during a screen printing process. In one embodiment, the printing head 1402 includes a plurality of actuators (e.g., stepper motors or servomotors) that are in communication with the system controller 1401 and are used to adjust the position and/or angular orientation of a screen printing mask (not shown) disposed within the printing head 1402 with respect to the substrate 1450 being printed. In one embodiment, the screen printing mask is a metal sheet or plate with a plurality of holes, slots, or other apertures formed there through to define a pattern and placement of screen printed material on a surface of a substrate 1450. In general, the screen printed pattern that is to be deposited on the surface of a substrate 1450 is aligned to the substrate 1450 in an automated fashion by orienting the screen printing mask using the actuators and information received by the system controller 1401 from the inspection system 1460.

Figure 15:
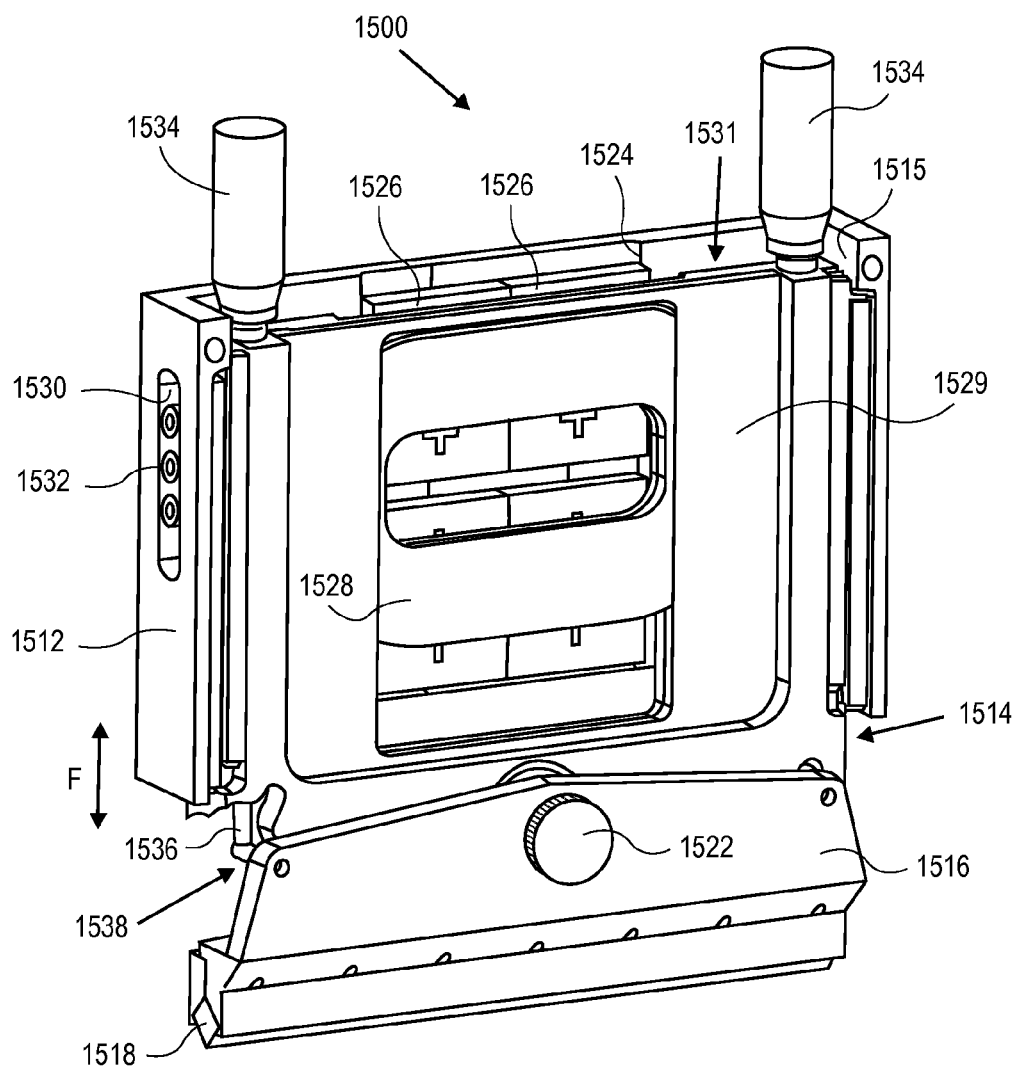
FIG. 15 is a perspective view of a blade which may be used for implementing embodiments of the present invention.

FIG. 15 is a perspective view of a blade 1500 which may be used for implementing embodiments of the present invention, e.g., by inclusion in system 1400, described above.

Referring to FIG. 15, blade 1500 includes a fixed support frame 1512. The frame 1512 has a housing seating 1515, in which a slider 1514 is slidingly positioned, mobile in the direction indicated by the arrow F. For example, the slider 1514 is able to move in the direction commonly known in the state of the art as direction Z, orthogonal to a plane XY commonly identified as the plane parallel to the plane and along which plane XY the blade 1500 moves in order to carry out a printing operation.

The frame 1512 has laterally at least a sliding eyelet 1530 in which a plurality of sliding elements are able to slide, of the rolling type 1532, associated with the slider 1514 to guide and support the motion of the slider 1514 relative to the frame 1512. The slider 1514 is hinged by means of a screw 1522 to a lower rocker arm plate 1516 which, in turn, supports and positions from below a print extremity 1518. The print extremity 1518 has a quadrangular shape developing along the length of the rocker arm plate 1516.

In particular, the rocker arm plate 1516 is pivoted centrally about the screw 1522 at a lower attachment end 1515 of the slider 1514. The pivoting allows a desired angular play of the print extremity 1518 of the blade 1500 around a pivoting axis. In this way, being able to pivot, the print extremity 1518 is configured so as to adapt its facing corner to different or non homogeneous distribution of print material. The frame 1512 has other housing seatings 1524, in which a plurality of permanent magnets 1526 are disposed and fixed. The magnets 1526, in this case see the "+" polarities in FIG. 15, are able to generate a desired magnetic field of constant intensity. The slider 1514 includes a support plate 1529, attached by attachment elements such as screws. The support plate 1529 defines in cooperation with the frame 1512 an interstice 1531, in which an electric coil 1528 is provided, typically consisting of one or more spirals of a conductor material. According to some embodiments, the electric coil 1528 is of the type provided with a number of spirals chosen between about 100 and about 1000. The electric coil 1528 faces the magnets 1526 and is attached and made solid with the support plate 1529 of the slider 1514. The electric coil 1528 is able to be fed with electric current, with a desired intensity and advantageously adjustable, for example in intensity and phase.

The electric current circulating in the electric coil 1528 interacts with the magnetic field of the magnets 1526, generating a magnetic force that determines a thrust on the electric coil 1528, which, being fixed to the slider 1514, consequently draws the latter in movement in the direction indicated by the arrow F. Consequently, the combination of the magnets 1526 and electric coil 1528 defines, in this case, a movement system of the voice coil linear actuator type to control the movement of the blade in direction Z. By controlling the current circulating in the electric coil 1528 it is possible to selectively modify the electric coil 1528 itself with respect to the magnets 1526, for the purposes of positioning the slider 1514 with respect to the support frame 1512. In particular, it is possible to selectively invert the direction of travel of the electric current in the electric coil 1528 to determine the movement upward or downward (arrow F) of the slider 1514 and therefore of the print extremity 1518 of the blade 1500. Also, when no power is applied, and hence with no current circulating in the electric coil 1528, the blade 1500 descends downward due to gravity and the voice coil motor works by holding it in the raised position. This has the advantage that the weight of the blade 1500 itself is used to determine the pressure used for printing.

In an embodiment, the blade 1500 is associated with the system controller 1401 of system 1400. By use of software contained in memorization means, the system controller 1401 is able to regulate the intensity of current circulating in the electric coil 1528, so as to modulate the magnetic force that moves the slider 1514. In this way, it is possible to control finely the position of the blade 1500. It is also possible, by varying the current in the electric coil 1528, to regulate the pressure with which the blade 1500, in particular the print extremity 1518, acts during screen printing.

The blade 1500 may also include a pair of micrometric regulators 1534, which allow to effect an adjustment that varies from fractions of a millimeter to fractions of a centimeter. In this case the micrometric regulators 1534 are disposed in the housing seating 1515, at the sides of the slider 1514 and attached to, or in any case associated with, the support frame 1512. The micrometric regulators 1534 are provided with linear actuators 1536, which are in turn directly coupled to opposite ends 1538 of the rocker arm plate 1516 and which are able to be activated to act on an end 1538, in order to regulate the amplitude of the oscillation and the angular play of the blade 1500 around the pivoting axis. By acting on the upper end of the micrometric regulators 1534 it is possible to vary the extension of the linear actuators 1536, and consequently to determine a desired angular limit to the amplitude of the oscillation of the rocker arm plate 1516 which supports the print extremity 1518 and thus obtain a better and accurate regulation of the blade 1500.

It is clear that modifications and/or additions of parts may be made to the blade 1500 for silk-screen printing on a substrate as described heretofore, without departing from the field and scope of the present invention. It is also clear that, although the present invention has been described with reference to specific examples, a person of skill in the art shall certainly be able to achieve many other equivalent forms of blade for silk-screen printing on a substrate, having the characteristics as set forth in the claims and hence all coming within the field of protection defined thereby.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 1200 described in association with FIG. 12 and/or with the system controller 1401 described in association with FIG. 14. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 16:
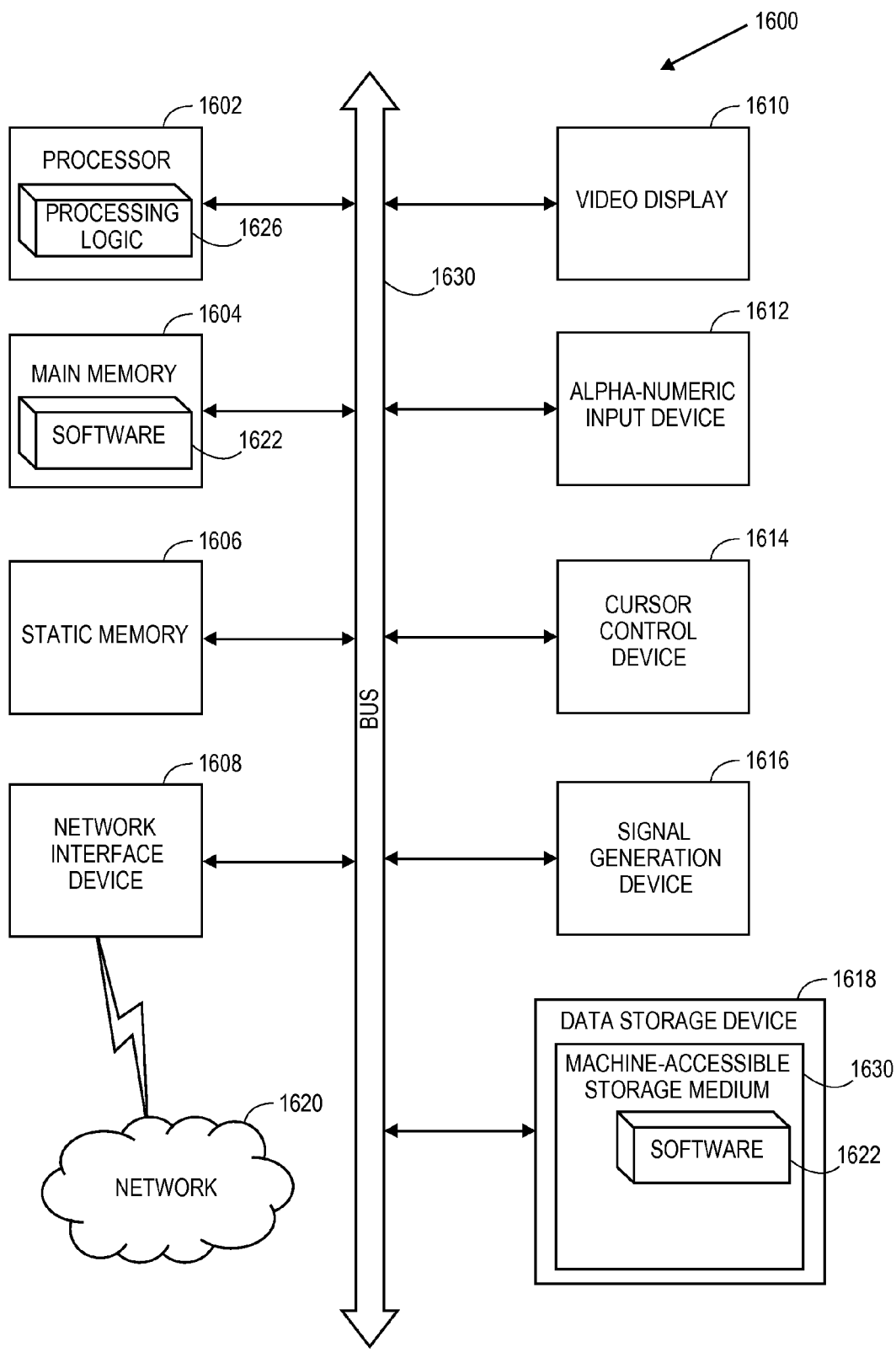
FIG. 16 illustrates a block diagram of an exemplary computer system, in accordance with an embodiment of the present invention.

FIG. 16 illustrates a diagrammatic representation of a machine in the exemplary form of a computer system 1600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1600 includes a processor 1602, a main memory 1604 (e.g., read-only memory (ROM), flash memory, dynamic random access memory (DRAM) such as synchronous DRAM (SDRAM) or Rambus DRAM (RDRAM), etc.), a static memory 1606 (e.g., flash memory, static random access memory (SRAM), etc.), and a secondary memory 1618 (e.g., a data storage device), which communicate with each other via a bus 1630.

Processor 1602 represents one or more general-purpose processing devices such as a microprocessor, central processing unit, or the like. More particularly, the processor 1602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1602 may also be one or more special-purpose processing devices such as an application specific integrated circuit (ASIC), a field programmable gate array (FPGA), a digital signal processor (DSP), network processor, or the like. Processor 1602 is configured to execute the processing logic 1626 for performing the operations described herein.

The computer system 1600 may further include a network interface device 1608. The computer system 1600 also may include a video display unit 1610 (e.g., a liquid crystal display (LCD), a light emitting diode display (LED), or a cathode ray tube (CRT)), an alphanumeric input device 1612 (e.g., a keyboard), a cursor control device 1614 (e.g., a mouse), and a signal generation device 1616 (e.g., a speaker).

The secondary memory 1618 may include a machine-accessible storage medium (or more specifically a computer-readable storage medium) 1631 on which is stored one or more sets of instructions (e.g., software 1622) embodying any one or more of the methodologies or functions described herein. The software 1622 may also reside, completely or at least partially, within the main memory 1604 and/or within the processor 1602 during execution thereof by the computer system 1600, the main memory 1604 and the processor 1602 also constituting machine-readable storage media. The software 1622 may further be transmitted or received over a network 1620 via the network interface device 1608.

While the machine-accessible storage medium 1631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a machine-accessible storage medium has instructions stored thereon which cause a data processing system to perform a method of dicing a semiconductor wafer having a plurality of integrated circuits separated by streets involves screen-printing a patterned mask above the semiconductor wafer, the patterned mask covering the integrated circuits and exposing the streets of the semiconductor wafer. The method also involves laser ablating the streets with a laser scribing process to expose regions of the semiconductor wafer between the integrated circuits. The method also involves plasma etching the semiconductor wafer through the exposed regions of the semiconductor wafer to singulate the integrated circuits. The patterned mask protects the integrated circuits during the plasma etching.

In accordance with an embodiment of the present invention, a machine-accessible storage medium has instructions stored thereon which cause a data processing system to perform a method of dicing a semiconductor wafer having a plurality of integrated circuits separated by streets involves screen-printing a blanket masking layer above the semiconductor wafer, the blanket masking covering the integrated circuits and the streets of the semiconductor wafer. The method also involves laser ablating portions of the blanket masking layer and the streets with a laser scribing process to provide a patterned mask and to expose regions of the semiconductor wafer between the integrated circuits. The method also involves plasma etching the semiconductor wafer through the exposed regions of the semiconductor wafer to singulate the integrated circuits. The patterned mask protects the integrated circuits during the plasma etching.

Thus, methods of using a screen-print mask for wafer dicing using laser scribing and plasma etch have been disclosed.

What is claimed is:

1. A method of dicing a semiconductor wafer comprising a plurality of integrated circuits separated by streets, the method comprising:
   screen-printing a patterned mask above the semiconductor wafer, the patterned mask covering the integrated circuits and exposing the streets of the semiconductor wafer, wherein the patterned mask is a sacrificial patterned mask;
   laser ablating the streets with a laser scribing process to expose regions of the semiconductor wafer between the integrated circuits; and
   plasma etching the semiconductor wafer through the exposed regions of the semiconductor wafer to singulate the integrated circuits, wherein the patterned mask protects the integrated circuits during the plasma etching.

2. The method of claim 1, wherein screen-printing the patterned mask comprises screen-printing a water-soluble mask.

3. The method of claim 2, wherein screen-printing the water-soluble mask comprises screen-printing a water-soluble material having a viscosity approximately in the range of 10,000 -80,000centiPoise.

4. The method of claim 3, further comprising:
   subsequent to screen-printing the water-soluble material, baking the water-soluble material at a temperature less than approximately 100 degrees Celsius.

5. The method of claim 2, further comprising:
   subsequent to plasma etching the semiconductor wafer, removing the water-soluble mask with an aqueous solution.

6. The method of claim 2, wherein screen-printing the water-soluble mask comprises screen-printing a material selected from the group consisting of polyvinyl alcohol, polyacrylic acid, dextran, polymethacrylic acid, polyethylene imine, and polyethylene oxide.

7. The method of claim 1, wherein laser ablating the streets with the laser scribing process comprises using a femto-second based laser process, and wherein plasma etching the semiconductor wafer comprises using a high density plasma etching process.

8. A method of dicing a semiconductor wafer comprising a plurality of integrated circuits separated by streets, the method comprising:
   screen-printing a blanket masking layer above the semiconductor wafer, the blanket masking covering the integrated circuits and the streets of the semiconductor wafer, wherein the blanket masking layer is a sacrificial blanking masking layer;
   laser ablating portions of the blanket masking layer and the streets with a laser scribing process to provide a patterned mask and to expose regions of the semiconductor wafer between the integrated circuits; and
   plasma etching the semiconductor wafer through the exposed regions of the semiconductor wafer to singulate the integrated circuits, wherein the patterned mask protects the integrated circuits during the plasma etching.

9. The method of claim 8, wherein screen-printing the blanket masking layer comprises screen-printing a water-soluble material layer.

10. The method of claim 9, wherein screen-printing the water-soluble material layer comprises screen-printing a water-soluble material layer having a viscosity approximately in the range of 2000-10,000 centiPoise.

11. The method of claim 10, further comprising:
    subsequent to screen-printing the water-soluble material layer, baking the water-soluble material layer at a temperature less than approximately 100 degrees Celsius.

12. The method of claim 9, further comprising:
    subsequent to plasma etching the semiconductor wafer, removing the patterned mask with an aqueous solution.

13. The method of claim 9, wherein screen-printing the water-soluble material layer comprises screen-printing a material selected from the group consisting of polyvinyl alcohol, polyacrylic acid, dextran, polymethacrylic acid, polyethylene imine, and polyethylene oxide.

14. The method of claim 8, wherein laser ablating portions of the blanket masking layer and the streets with the laser scribing process comprises using a femto-second based laser process, and wherein plasma etching the semiconductor wafer comprises using a high density plasma etching process.

15. A system for dicing a semiconductor wafer comprising a plurality of integrated circuits, the system comprising: a factory interface; a screen print processing system coupled with the factory interface; a laser scribe apparatus coupled with the factory interface; and a plasma etch chamber coupled with the factory interface wherein the screen print processing system is configured for screen printing a patterned mask, the screen print processing system comprising one or more cameras for aligning a screen with a semiconductor wafer.

16. The system of claim 15, wherein the screen print processing system and the plasma etch chamber are housed in a cluster tool coupled with the factory interface.

17. The system of claim 16, wherein the screen print processing system is configured to screen print a water soluble mask, and the cluster tool further comprising:
   a wet station configured to remove the water-soluble mask layer.

18. The system of claim 15, wherein the screen print processing system is configured for screen printing a blanket mask layer.

19. The system of claim 15, wherein the screen print processing system houses a blade apparatus.

* * * * *